United States Patent
Yamazaki et al.

(10) Patent No.: US 11,536,889 B2
(45) Date of Patent: Dec. 27, 2022

(54) DISPLAY DEVICE AND DATA PROCESSING DEVICE

(71) Applicant: SEMICONDUCTOR ENERGY LABORATORY CO., LTD., Atsugi (JP)

(72) Inventors: Shunpei Yamazaki, Tokyo (JP); Ryo Hatsumi, Kanagawa (JP); Tetsuji Ishitani, Kanagawa (JP); Akio Yamashita, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/296,832

(22) PCT Filed: Dec. 2, 2019

(86) PCT No.: PCT/IB2019/060345
§ 371 (c)(1),
(2) Date: May 25, 2021

(87) PCT Pub. No.: WO2020/121110
PCT Pub. Date: Jun. 18, 2020

(65) Prior Publication Data
US 2022/0026623 A1    Jan. 27, 2022

(30) Foreign Application Priority Data

Dec. 14, 2018 (JP) .............................. JP2018-234281
Mar. 22, 2019 (JP) .............................. JP2019-054311

(51) Int. Cl.
*G02F 1/1362* (2006.01)
*F21V 8/00* (2006.01)
(Continued)

(52) U.S. Cl.
CPC ........... *G02B 6/0046* (2013.01); *G02B 6/003* (2013.01); *G02B 6/0055* (2013.01);
(Continued)

(58) Field of Classification Search
CPC ....................................................... G02F 1/13
See application file for complete search history.

(56) References Cited

U.S. PATENT DOCUMENTS 6,379,017 B2    4/2002    Nakabayashi et al.
10,453,381 B2   10/2019   Kurokawa
(Continued)

FOREIGN PATENT DOCUMENTS

CN    101846833 A    9/2010
CN    107548471 A    1/2018
(Continued)

OTHER PUBLICATIONS

International Search Report (Application No. PCT/IB2019/060345) dated Feb. 4, 2020.
(Continued)

*Primary Examiner* — Sang V Nguyen
(74) *Attorney, Agent, or Firm* — Nixon Peabody LLP; Jeffrey L. Costellia

(57) ABSTRACT

A novel display device that is highly convenient, useful, or reliable is provided. The display device includes a light guide plate, a display panel, and an intermediate layer, and the light guide plate includes a first surface and a second surface. The first surface is irradiated with light, the second surface has a function of distributing light, the second surface is in contact with the intermediate layer, and the second surface has a first refractive index N1 in a region in contact with the intermediate layer. The display panel faces the second surface, the display panel is in contact with the intermediate layer, and the display panel has a function of
(Continued)

scattering the distributed light. The intermediate layer includes a region positioned between the second surface and the display panel, and the intermediate layer has a second refractive index $N2$ in a region in contact with the second surface. The second refractive index $N2$ is smaller than the first refractive index $N1$.

20 Claims, 21 Drawing Sheets

(51) Int. Cl.
G02F 1/137 (2006.01)
G02F 1/1337 (2006.01)
G02F 1/1343 (2006.01)
G02F 1/1368 (2006.01)
H01L 27/12 (2006.01)

(52) U.S. Cl.
CPC .......... *G02F 1/1337* (2013.01); *G02F 1/1368* (2013.01); *G02F 1/13756* (2021.01); *G02F 1/13775* (2021.01); *G02F 1/134309* (2013.01); *G02F 1/136213* (2013.01); *G02F 1/136286* (2013.01); *H01L 27/124* (2013.01); *H01L 27/1255* (2013.01); *G02F 2202/28* (2013.01); *G02F 2203/03* (2013.01)

(56) References Cited

U.S. PATENT DOCUMENTS

| | | | |
|---|---|---|---|
| 10,585,316 | B2 | 3/2020 | Junge et al. |
| 2001/0019479 | A1 | 9/2001 | Nakabayashi et al. |
| 2008/0284929 | A1* | 11/2008 | Kimura ............... G02F 1/13624 349/48 |
| 2010/0245321 | A1* | 9/2010 | Ogita .................... G02F 1/1334 345/211 |
| 2011/0248970 | A1* | 10/2011 | Koyama .............. G09G 3/3426 345/204 |
| 2012/0120677 | A1* | 5/2012 | Miyairi ................ G02B 6/0035 362/616 |
| 2013/0322111 | A1* | 12/2013 | Nishitani ............. G02B 6/0028 362/603 |
| 2018/0005566 | A1 | 1/2018 | Kurokawa |
| 2018/0024403 | A1 | 1/2018 | Yata et al. |
| 2018/0157088 | A1 | 6/2018 | Junge et al. |

FOREIGN PATENT DOCUMENTS

| | | |
|---|---|---|
| EP | 0879991 A | 11/1998 |
| EP | 2233967 A | 9/2010 |
| EP | 3289408 A | 3/2018 |
| JP | 11-232919 A | 8/1999 |
| JP | 11-242220 A | 9/1999 |
| JP | 2010-231069 A | 10/2010 |
| JP | 2018-025758 A | 2/2018 |
| JP | 2018-520372 | 7/2018 |
| KR | 1998-0086997 A | 12/1998 |
| KR | 2017-0140360 A | 12/2017 |
| TW | 201704820 | 2/2017 |
| WO | WO-2018/002784 | 1/2018 |

OTHER PUBLICATIONS

Written Opinion (Application No. PCT/IB2019/060345) dated Feb. 4, 2020.

\* cited by examiner

DISPLAY DEVICE AND DATA PROCESSING DEVICE

TECHNICAL FIELD

One embodiment of the present invention relates to a display device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof. Note that a system including the above-described data processing device (also referred to as a data processing system) is also included in one embodiment of the present invention.

BACKGROUND ART

There is known a display device including a first substrate having light transmissivity; a second substrate facing the first substrate and having light transmissivity; a light-modulating layer arranged between the first substrate and the second substrate; a light source unit illuminating the light-modulating layer from an outer side of a position facing a display region that displays images, along a normal direction; first to third color filters of different colors of red, green, and blue arranged on the first substrate; and first to third electrodes facing the first to third color filters, respectively, in which the light-modulating layer is capable of changing the light dispersibility of regions opposite to the first to third color filters according to electric fields produced by the first to third electrodes, respectively (Patent Document 1).

REFERENCE

Patent Document

[Patent Document 1] United States Patent Application Publication No. 2018/0024403

SUMMARY OF THE INVENTION

Problems to be Solved by the Invention

An object of one embodiment of the present invention is to provide a novel display device that is highly convenient, useful, or reliable. Another object is to provide a novel data processing device that is highly convenient, useful, or reliable. Another object is to provide a novel display device, a novel data processing device, or a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems (1) One embodiment of the present invention is a display device including a light guide plate, a display panel, and an intermediate layer.

The light guide plate includes a first surface and a second surface. The first surface is irradiated with light. The second surface has a function of distributing the light, the second surface is in contact with the intermediate layer, and the second surface has a first refractive index in a region in contact with the intermediate layer.

The display panel faces the second surface, the display panel is in contact with the intermediate layer, and the display panel has a function of scattering the distributed light.

The intermediate layer includes a region positioned between the second surface and the display panel, and the intermediate layer has a second refractive index in a region in contact with the second surface. The second refractive index is smaller than the first refractive index.

(2) One embodiment of the present invention is the above-described display device in which the display panel includes a display region.

The light guide plate includes a third surface. The third surface has a slope $\phi$ with respect to the second surface in a region overlapping with the display region. The slope $\phi$ is 2° or less in a cross section including a thickness direction of the light guide plate.

Thus, the distribution of light distributed by the second surface can be close to a uniform distribution. Alternatively, light can be effectively utilized. Alternatively, light with an almost uniform distribution can be distributed over the display panel. As a result, a novel display device that is highly convenient, useful, or reliable can be provided.

(3) One embodiment of the present invention is a display device including a light guide plate and a display panel.

The light guide plate includes a first surface and a second surface, and the first surface is irradiated with light.

The light emitted to the first surface has a first intensity distribution in a cross section including a thickness direction of the light guide plate. In addition, the light has a second intensity distribution in a cross section orthogonal to the thickness direction, and the second intensity distribution is wider than the first intensity distribution.

The second surface is included in a plane intersecting a plane including the first surface, and the second surface has a function of distributing the light.

The display panel faces the second surface, and the display panel has a function of scattering the distributed light.

Thus, light leaked from the light guide plate can be reduced. Alternatively, light can be effectively utilized. Alternatively, uniformly distributed light can be distributed over the display panel. As a result, a novel display device that is highly convenient, useful, or reliable can be provided.

(4) One embodiment of the present invention is the above-described display device in which the light guide plate includes a third surface.

The third surface faces the second surface, and the third surface has a critical angle $\theta$.

In the first intensity distribution, 90% or more of the distribution falls within a range from $(-90°+\theta)$ to $(90°-\theta)$ in a plane including the thickness direction, with a line of intersection with a plane orthogonal to the thickness direction as a center.

Thus, light whose incident angle is smaller than or equal to the critical angle $\theta$ can be reduced. Alternatively, light that the light guide plate cannot easily reflect totally can be reduced. Alternatively, light that is less likely to reach the second surface can be reduced. As a result, a novel display device that is highly convenient, useful, or reliable can be provided.

(5) One embodiment of the present invention is the above-described display device including a light source and an optical element.

The optical element has a function of adjusting an intensity distribution of light emitted from the light source to the intensity distributions of the light.

(6) One embodiment of the present invention is the above-described display device in which the optical element includes a first lens.

The first lens includes a curved surface, and the curved surface has a first curvature radius in the plane including the thickness direction and has a second curvature radius in a plane including a width direction intersecting the thickness direction.

The second curvature radius is larger than the first curvature radius.

Consequently, the second intensity distribution can be made wider than the first intensity distribution. As a result, a novel display device that is highly convenient, useful, or reliable can be provided.

(7) One embodiment of the present invention is the above-described display device in which the optical element includes a second lens.

The second lens has a third curvature radius in the plane including the thickness direction, and the third curvature radius is different from the first curvature radius.

Moreover, the second lens has a fourth curvature radius in the plane including the width direction, and the fourth curvature radius is larger than the third curvature radius.

Thus, light having different first intensity distributions can be supplied to the light guide plate. Alternatively, the distribution of light supplied to the display panel can be controlled using a plurality of types of light having different first intensity distributions. Alternatively, the degree of freedom for controlling the distribution of light supplied to the display panel can be increased. As a result, a novel display device that is highly convenient, useful, or reliable can be provided.

(8) One embodiment of the present invention is the above-described display device in which the optical element includes a prism. The prism includes a sloping surface extending in the width direction.

Thus, a component of light that travels in a direction orthogonal to the plane including the thickness direction and the width direction can be relatively increased. Alternatively, light supplied to the display panel can be increased. Alternatively, display can be made bright. As a result, a novel display device that is highly convenient, useful, or reliable can be provided.

(9) One embodiment of the present invention is the above-described display device in which the light guide plate includes a fourth surface.

The fourth surface faces the first surface, and the fourth surface includes a reflective film. The reflective film has a function of reflecting the light.

Thus, light leaked from the fourth surface can be reduced. Alternatively, light that reaches the fourth surface can be returned to the light guide plate. Alternatively, the distribution of light supplied to the display panel can be close to a uniform distribution. Alternatively, display can be made bright. As a result, a novel display device that is highly convenient, useful, or reliable can be provided.

(10) One embodiment of the present invention is the above-described display device in which the display panel includes a display region and the display region includes a first scan line, a second scan line, a first signal line, a second signal line, and a pixel.

The pixel includes a display element and a pixel circuit, and the display element is electrically connected to the pixel circuit.

The pixel circuit is electrically connected to the first scan line, the second scan line, the first signal line, and the second signal line.

The pixel circuit includes a first switch, a second switch, a first capacitor, a second capacitor, a node, and a conductive film.

The first switch includes a first terminal supplied with a first signal, and the first switch includes a second terminal electrically connected to the node.

The first capacitor includes a first electrode electrically connected to the node, and the first capacitor includes a second electrode electrically connected to the conductive film.

The second switch includes a first terminal supplied with a second signal, and the second switch includes a second terminal electrically connected to a first electrode of the second capacitor.

The second capacitor includes a second electrode electrically connected to the node.

(11) One embodiment of the present invention is the above-described display device in which the display region includes a group of pixels and a different group of pixels.

The group of pixels is arranged in a row direction, and the group of pixels includes the pixel.

The different group of pixels is arranged in a column direction intersecting the row direction, and the different group of pixels includes the pixel.

The first scan line is electrically connected to the group of pixels, and the second scan line is electrically connected to the group of pixels.

The first signal line is electrically connected to the different group of pixels, and the second signal line is electrically connected to the different group of pixels.

Thus, image information can be supplied to a plurality of pixels. As a result, a novel display device that is highly convenient, useful, or reliable can be provided.

(12) One embodiment of the present invention is the above-described display device in which the display element includes a first electrode, a second electrode, a layer containing a liquid crystal material, a first alignment film, and a second alignment film.

The first alignment film includes a region positioned between the first electrode and the layer containing a liquid crystal material, and the second alignment film includes a region positioned between the second electrode and the layer containing a liquid crystal material.

The second electrode is positioned such that an electric field crossing the layer containing a liquid crystal material is formed between the first electrode and the second electrode.

The layer containing a liquid crystal material scatters incident light with a first scattering intensity when the electric field is in a first state, and the layer containing a liquid crystal material scatters the incident light with a second scattering intensity when the electric field is in a second state where the electric field is stronger than the electric field in the first state. Note that the second scattering intensity is greater than or equal to 10 times the first scattering intensity.

The layer containing a liquid crystal material contains a liquid crystal material and a polymer material and is stabilized with the polymer material. Note that the polymer material is a copolymer of a polyfunctional monomer and a monofunctional monomer.

Thus, incident light can be scattered more strongly with a second electric field intensity that is higher than a first electric field intensity. Alternatively, the power consumed in the state of easily transmitting incident light can be reduced. As a result, a novel liquid crystal element that is highly convenient, useful, or reliable can be provided.

(13) One embodiment of the present invention is a data processing device including a keyboard, a hardware button, a pointing device, a touch sensor, an illuminance sensor, an imaging device, an audio input device, an eye-gaze input device, an attitude sensing device, and the above-described display device.

Thus, image information or control information can be generated by an arithmetic device on the basis of information supplied using a variety of input devices. As a result, a novel data processing device that is highly convenient, useful, or reliable can be provided.

Although the block diagram in which components are classified by their functions and shown as independent blocks is shown in the drawings attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the source and the drain interchange with each other according to the above relation of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel data processing device that is highly convenient, useful, or reliable can be provided. Alternatively, a novel data processing device can be provided.

Note that the description of these effects does not preclude the existence of other effects. Note that one embodiment of the present invention does not need to have all these effects. Note that effects other than these will be apparent from and can be derived from the description of the specification, the drawings, the claims, and the like.

BRIEF DESCRIPTION OF THE DRAWINGS

FIG. 10A and FIG. 10B1 to FIG. 10B3 are diagrams illustrating structures of a display device according to an embodiment.

MODE FOR CARRYING OUT THE INVENTION

Figure 1A:
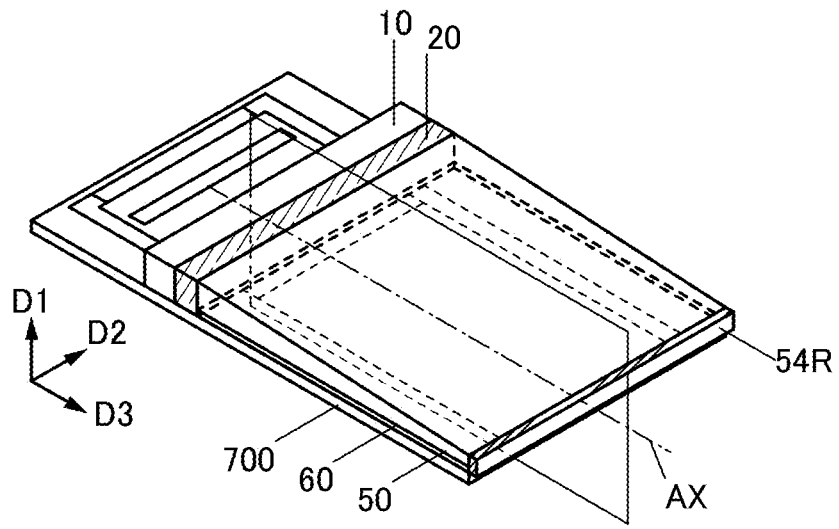
FIG. 1A to FIG. 1C are diagrams illustrating a structure of a display device according to an embodiment.

A display device of one embodiment of the present invention includes a light guide plate and a display panel, and the light guide plate has a first surface and a second surface. The first surface is irradiated with light; the light has a first intensity distribution in a cross section including the thickness direction of the light guide plate and a second intensity distribution in a cross section orthogonal to the thickness direction; and the second intensity distribution is wider than the first intensity distribution. The second surface is included in a plane intersecting a plane including the first surface, and the second surface has a function of distributing light. The display panel faces the second surface, and the display panel has a function of scattering the distributed light.

Thus, light leaked from the light guide plate can be reduced. Alternatively, light can be effectively utilized. Alternatively, uniformly distributed light can be distributed over the display panel. As a result, a novel display device that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the present invention described below, the same portions or portions having similar functions are denoted by the same reference numerals in different drawings, and a description thereof is not repeated.

Embodiment 1

In this embodiment, a structure of a display device of one embodiment of the present invention will be described with reference to FIG. 1 to FIG. 3.

Figure 1B:
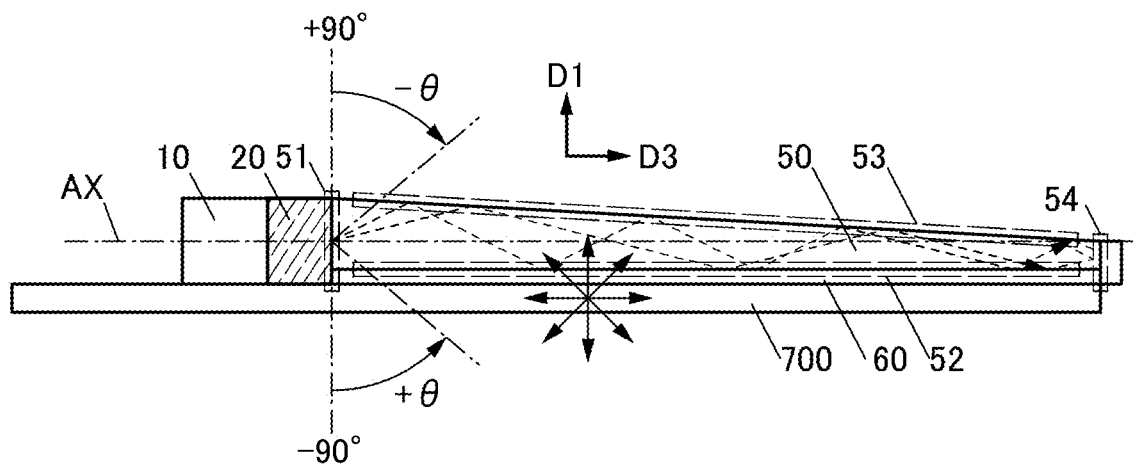
Figure 1C:
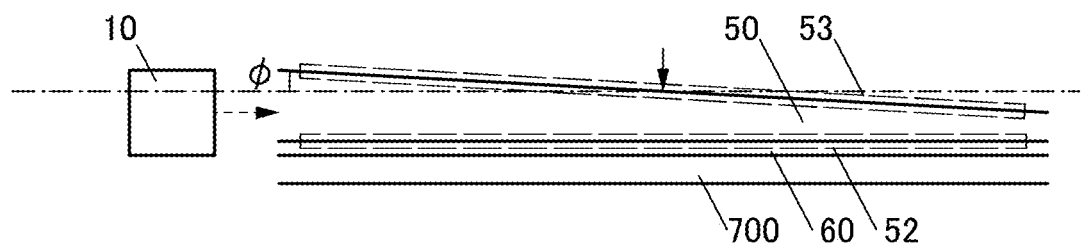

FIG. 1 illustrates a structure of the display device of one embodiment of the present invention. FIG. 1A is a perspective view of the display device of one embodiment of the present invention, and FIG. 1B is a cross-sectional view of a cutting plane D1-D3 in FIG. 1A. FIG. 1C is a diagram illustrating part of FIG. 1B.

FIG. 2 illustrates a structure of the display device of one embodiment of the present invention. FIG. 2A illustrates a light distribution curve schematically showing an intensity distribution in one plane of light emitted to a light guide plate 50 of the display device, and FIG. 2B illustrates a light distribution curve schematically showing an intensity distribution in another plane different from that in FIG. 2A. FIG. 2C is a diagram showing the light intensity distribution in FIG. 2A or FIG. 2B using emission angle dependence, and FIG. 2D is a diagram showing the intensity distribution of light that reaches a second surface 52 of the light guide plate 50 and has the emission angle dependence shown in FIG. 2C.

FIG. 3 illustrates a structure of the display device of one embodiment of the present invention. FIG. 3A is a perspective view of a light source 10 and an optical element 20 in the display device of one embodiment of the present invention, and FIG. 3B is a cross-sectional view of a cutting plane D1-D3 in FIG. 3A. FIG. 3C is a cross-sectional view illustrating part of FIG. 3B. FIG. 3D is a cross-sectional view of a cutting plane D2-D3 in FIG. 3A, and FIG. 3E is a cross-sectional view of a cutting plane D2 D3 different from that in FIG. 3D.

<Structure Example 1 of Display Device>

The display device of one embodiment of the present invention includes the light guide plate 50, a display panel 700, and an intermediate layer 60 (see FIG. 1A and FIG. 1B). The display device also includes the light source 10 and the optical element 20.

<<Structure Example 1 of Light Guide Plate 50>>

The light guide plate 50 includes a surface 51 and the surface 52, and the surface 51 is irradiated with light.

The surface 52 has a function of distributing light. The surface 52 is in contact with the intermediate layer 60, and the surface 52 has a refractive index N1 in a region in contact with the intermediate layer 60.

<<Structure Example 1 of Display Panel 700>>

The display panel 700 faces the surface 52, and the display panel 700 is in contact with the intermediate layer 60. The display panel 700 has a function of scattering the distributed light.

<<Structure Example 1 of Intermediate Layer 60>>

The intermediate layer 60 includes a region positioned between the surface 52 and the display panel 700.

The intermediate layer 60 has a refractive index N2 in a region in contact with the surface 52, and the refractive index N2 is smaller than the refractive index N1.

<<Structure Example 2 of Display Panel 700>>

The display panel 700 includes a display region.

<<Structure Example 2 of Light Guide Plate 50>>

The light guide plate 50 includes a surface 53. The surface 53 has a slope $\phi$ with respect to the surface 52 in a region overlapping with a display region 231. The slope $\phi$ is 2° or less in a cross section including the thickness direction of the light guide plate 50. Note that the slope $\phi$ of the surface 53 may be fixed or vary. Moreover, part of the surface 53 may include a region where the slope $\phi$ is zero. The slope $\phi$ is preferably a negative slope with respect to the direction of travel of light emitted from the light source 10 (see FIG. 1C). In other words, the cross-sectional shape of the light guide plate 50 in the cutting plane D1-D3 is preferably tapered.

Thus, the distribution of light distributed by the second surface 52 can be close to a uniform distribution. Alternatively, light distributed by the second surface 52 can be effectively utilized. Alternatively, light with an almost uniform distribution can be distributed over the display panel 700. As a result, a novel display device that is highly convenient, useful, or reliable can be provided.

<Structure Example 2 of Display Device>

The display device of one embodiment of the present invention includes the light guide plate 50 and the display panel 700 (see FIG. 1A and FIG. 1B).

<<Structure Example 3 of Light Guide Plate 50>>

The light guide plate 50 includes the surface 51 and the surface 52.

The surface 51 is irradiated with light. In a cross section including a thickness direction D1 of the light guide plate 50

Figure 2A:
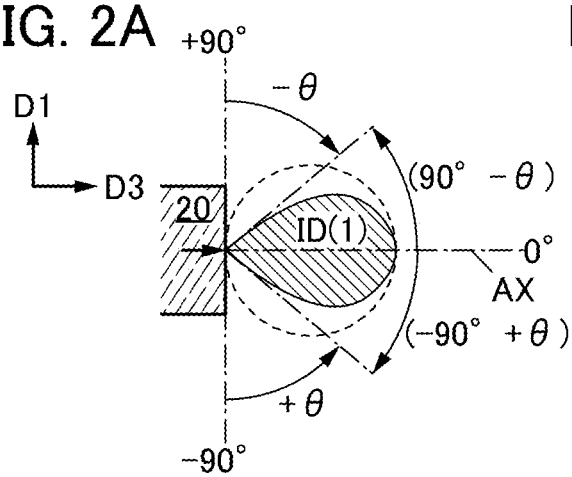
FIG. 2A to FIG. 2D are diagrams illustrating a structure of a display device according to an embodiment.
Figure 2B:
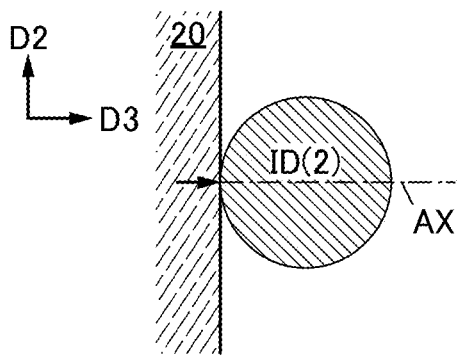

(e.g., the D1-D3 plane), light has an intensity distribution ID(1) (see FIG. 2A). In a cross section orthogonal to the thickness direction D1 (e.g., the D2-D3 plane), light has an intensity distribution ID(2) (see FIG. 2B). The intensity distribution ID(2) is wider than the intensity distribution ID(1).

The surface 52 is included in a plane intersecting a plane including the surface 51, and the surface 52 has a function of distributing light.

<<Structure Example 3 of Display Panel 700>>

The display panel 700 faces the surface 52, and the display panel 700 has a function of scattering light distributed by the surface 52.

Thus, light leaked from the light guide plate 50 can be reduced. Alternatively, light can be effectively utilized. Alternatively, uniformly distributed light can be distributed over the display panel 700. As a result, a novel display device that is highly convenient, useful, or reliable can be provided.

<<Structure Example 4 of Light Guide Plate 50>>

The light guide plate 50 includes the surface 53, and the surface 53 faces the surface 52. The surface 53 has a critical angle θ (see FIG. 1B).

Figure 2C:
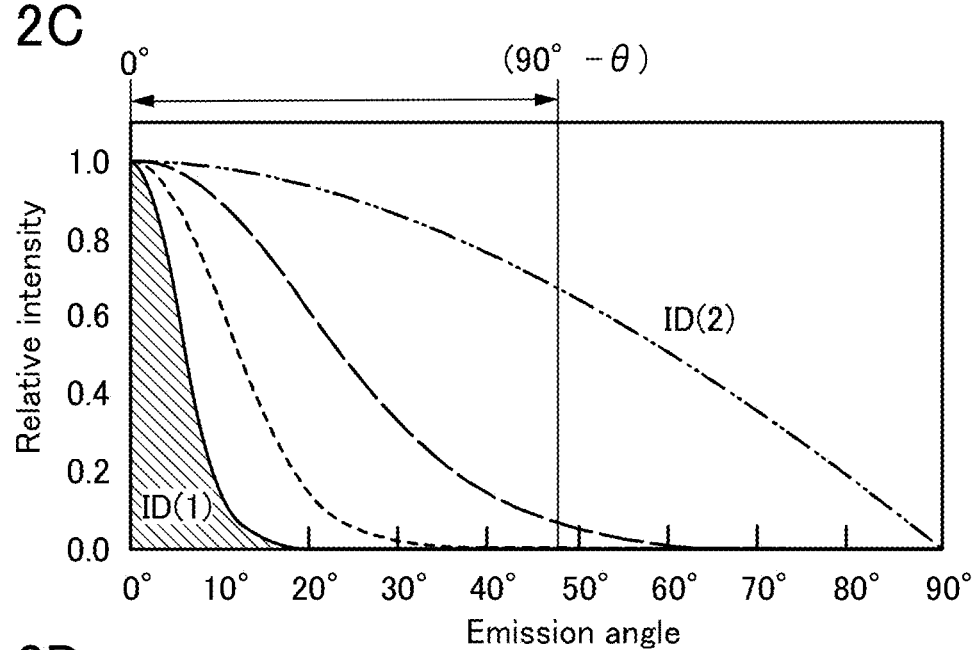
Figure 2D:
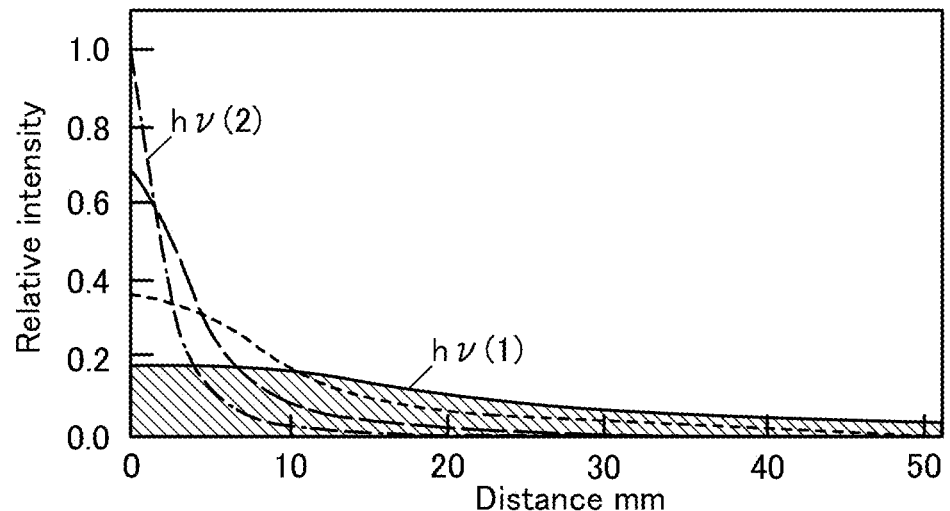

In the intensity distribution ID(1), 90% or more of the distribution falls within the range from (−90°+θ) to (90°−θ) in the plane including the thickness direction D1 (e.g., the D1-D3 plane), with a line AX of intersection with the plane orthogonal to the thickness direction D1 (e.g., the D2 D3 plane) as the center (see FIG. 1A, FIG. 2A, and FIG. 2C).

For example, light hv(1) having the intensity distribution ID(1) has higher directivity than light hv(2) having the intensity distribution ID(2) (see FIG. 2C). The light hv(1) having the intensity distribution ID(1) travels from the surface 51 toward a surface 54 further than the light hv(2) having the intensity distribution ID(2) (see FIG. 2D). Alternatively, light can be distributed over a wide range of the surface 52. Alternatively, light can be distributed over the surface 52 relatively evenly.

Thus, light whose incident angle is smaller than or equal to the critical angle θ can be reduced. Alternatively, light that the light guide plate 50 cannot easily reflect totally can be reduced. Alternatively, light that is less likely to reach the surface 52 can be reduced. As a result, a novel display device that is highly convenient, useful, or reliable can be provided.

<Structure Example 3 of Display Device>

Figure 3A:
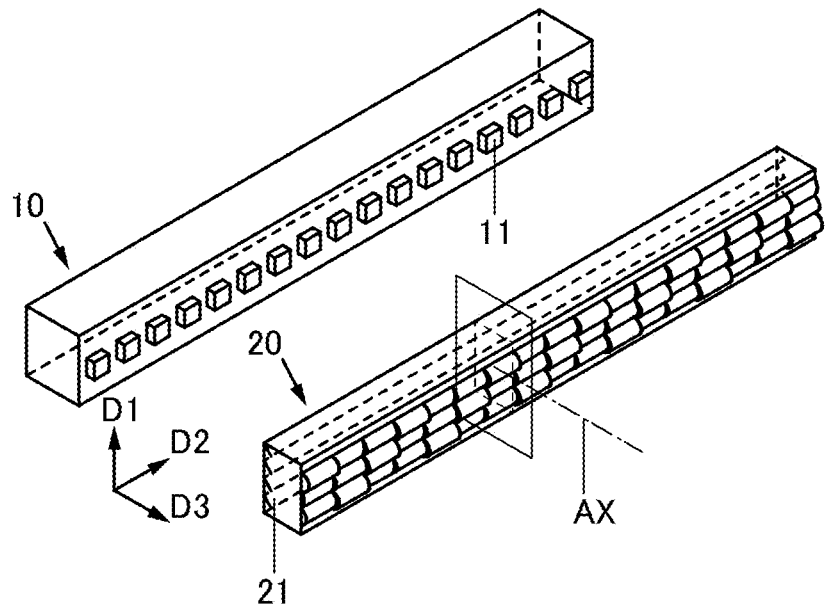
FIG. 3A to FIG. 3E are diagrams illustrating a structure of a display device according to an embodiment.

The display device of one embodiment of the present invention includes the light source 10 and the optical element 20 (see FIG. 1A and FIG. 3A). The light source 10 includes a light-emitting element 11. A light-emitting diode or the like can be used as the light-emitting element 11, for example.

<<Structure Example 1 of Optical Element 20>>

The optical element 20 has a function of adjusting an intensity distribution of light emitted from the light source 10 to a predetermined light intensity distribution.

Figure 3B:
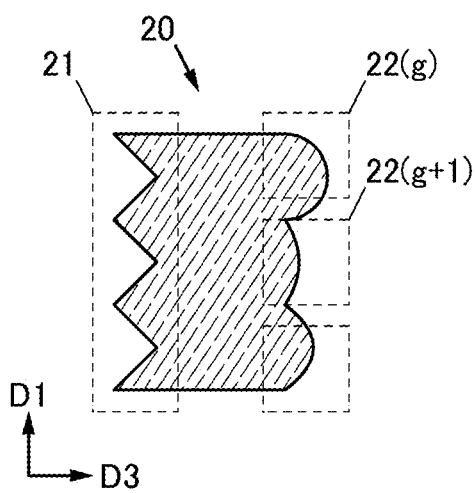

For example, the optical element 20 includes a lens 22(g) (see FIG. 3A and FIG. 3B). A microlens with a diameter of 1 mm or less can be used as the lens 22(g), for example. Alternatively, a linear Fresnel lens, a cylindrical lens, or a lenticular lens can be used as the lens 22(g). Alternatively, a lens array in which a plurality of lenses are arranged regularly or irregularly can be used as the optical element 20.

The lens 22(g) has a curved surface. The curved surface has a curvature radius R(1) in a plane including the thickness direction D1 (e.g., the D1-D3 plane) (see FIG. 3C).

Figure 3C:
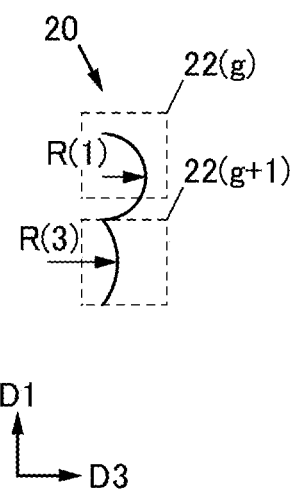
Figure 3D:
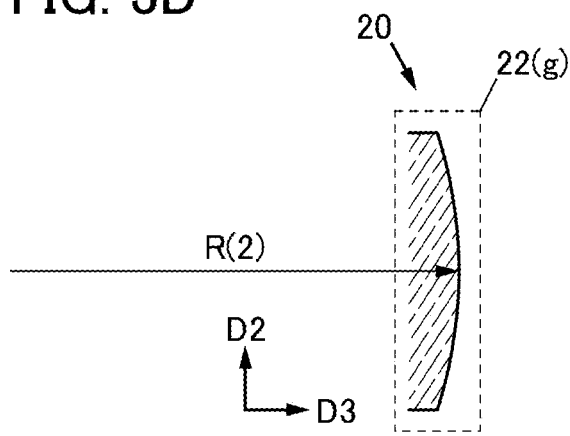

Moreover, the curved surface of the lens 22(g) has a curvature radius R(2) in a plane including a width direction D2 intersecting the thickness direction D1 (e.g., the D2-D3 plane) (see FIG. 3D). Note that the curvature radius R(2) is larger than the curvature radius R(1) (see FIG. 3C and FIG. 3D).

Thus, the intensity distribution ID(2) can be made wider than the intensity distribution ID(1). As a result, a novel display device that is highly convenient, useful, or reliable can be provided.

<<Structure Example 2 of Optical Element 20>>

The optical element 20 includes a lens 22(g+1) (see FIG. 3A, FIG. 3B, and FIG. 3C).

The lens 22(g+1) has a curved surface. The curved surface has a curvature radius R(3) in a plane including the thickness direction D1 (e.g., the D1-D3 plane). Note that the curvature radius R(3) is different from the curvature radius R(1). For example, lenses having different focal lengths can be used for the optical element 20. Specifically, a lens that distributes light to a region distant from the surface 51, a lens that distributes light to a region near the surface 51, or a lens that distributes light to a region therebetween can be used in combination.

Figure 3E:
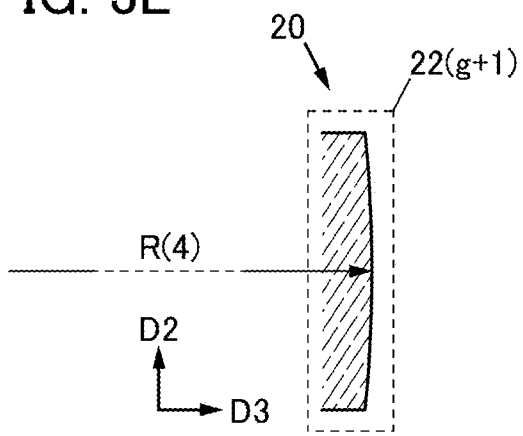

The curved surface of the lens 22(g+1) has a curvature radius R(4) in a plane including the width direction D2 (e.g., the D2 D3 plane), and the curvature radius R(4) is larger than the curvature radius R(3) (see FIG. 3C and FIG. 3E).

Thus, light having different intensity distributions ID(1) can be supplied to the light guide plate 50. Alternatively, the distribution of light supplied to the display panel 700 can be controlled using a plurality of types of light having different intensity distributions ID(1). Alternatively, the degree of freedom for controlling the distribution of light supplied to the display panel 700 can be increased. As a result, a novel display device that is highly convenient, useful, or reliable can be provided.

<<Structure Example 3 of Optical Element 20>>

The optical element 20 includes a prism 21, and the prism 21 has a sloping surface extending in the width direction D2 (see FIG. 3A and FIG. 3B). For example, a prism sheet can be used as the prism 21.

Thus, a component of light that travels in a direction orthogonal to the plane including the thickness direction D1 and the width direction D2 can be relatively increased. Light supplied to the display panel 700 can be increased. Alternatively, display can be made bright. As a result, a novel display device that is highly convenient, useful, or reliable can be provided.

<<Structure Example 3 of Light Guide Plate>>

The light guide plate 50 includes the surface 54. The surface 54 faces the surface 51 and includes a reflective film 54R (see FIG. 1A and FIG. 1B).

The reflective film 54R has a function of reflecting light. Note that the optical element 20 and the light source 10 may be additionally provided on the surface 54 so that light can be supplied from two directions. Alternatively, light may be supplied through a surface other than the surface 52 and the surface 53.

Thus, light leaked from the surface 54 can be reduced. Alternatively, light that reaches the surface 54 can be returned to the light guide plate 50. Alternatively, the distribution of light supplied to the display panel 700 can be close to a uniform distribution. Alternatively, display can be made bright. As a result, a novel display device that is highly convenient, useful, or reliable can be provided.

Note that this embodiment can be combined with other embodiments in this specification as appropriate.

Embodiment 2

In this embodiment, a structure of a display panel that can be used in the display device of one embodiment of the present invention will be described with reference to FIG. 4 to FIG. 7.

Figure 4A:
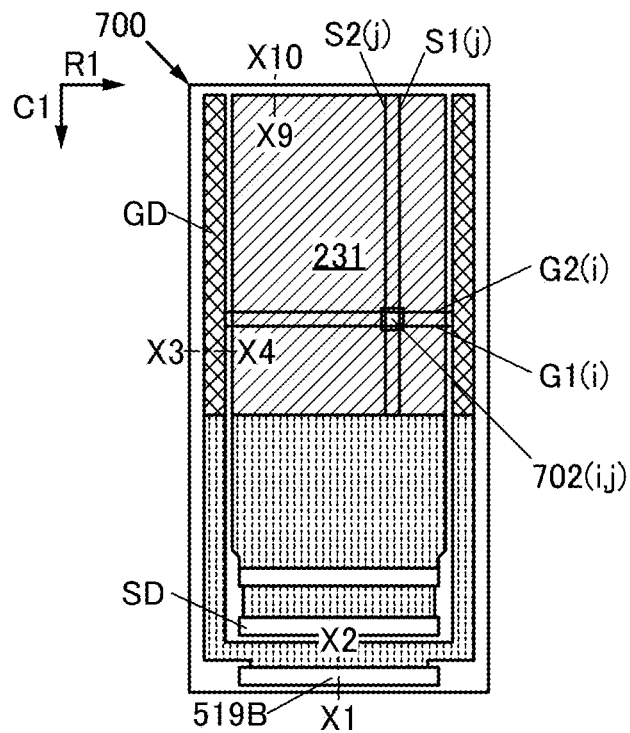
FIG. 4A and FIG. 4B are diagrams illustrating a structure of a display panel according to an embodiment.
Figure 4B:
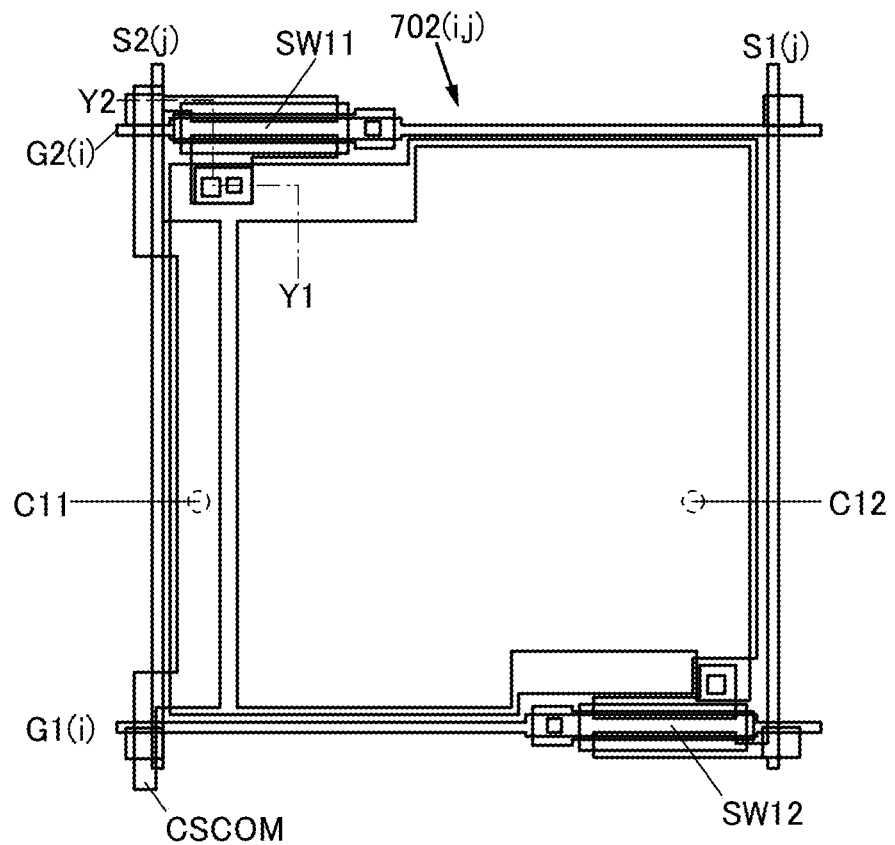

FIG. 4 illustrates a structure of a display panel that can be used in the display device of one embodiment of the present invention. FIG. 4A is a top view of the display panel that can be used in the display device of one embodiment of the present invention, and FIG. 4B is part of FIG. 4A.

Figure 5A:
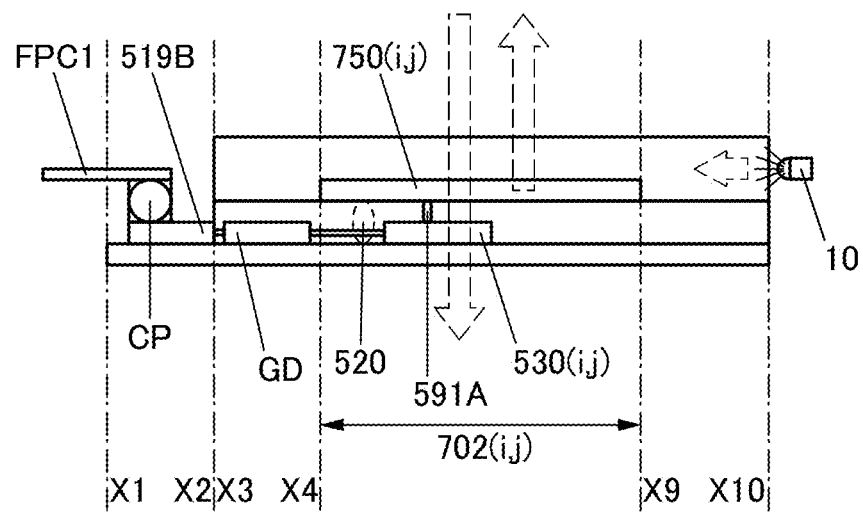
FIG. 5A and FIG. 5B are diagrams illustrating a structure of a display panel according to an embodiment.
Figure 5B:
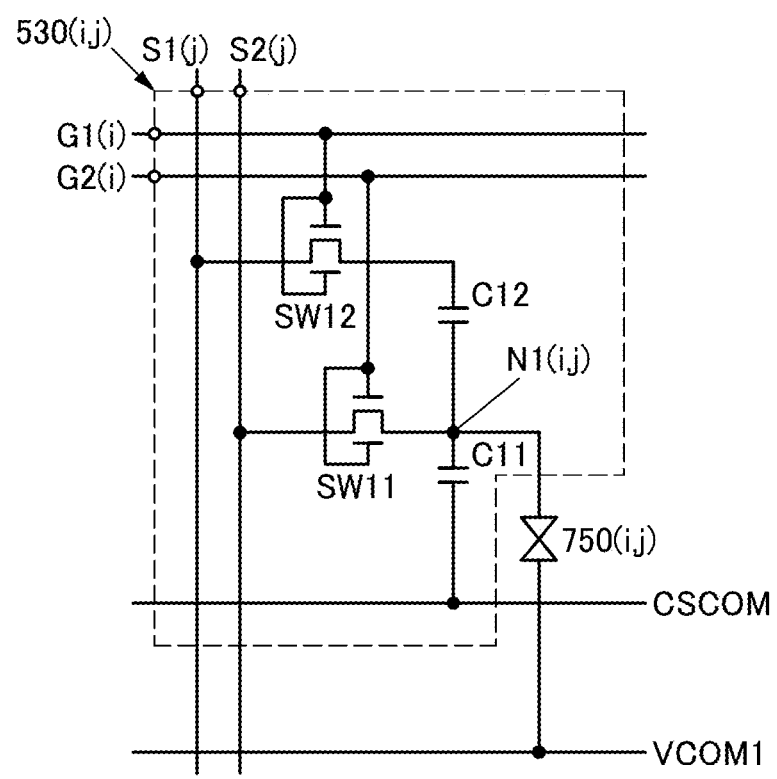

FIG. 5 illustrates the structure of the display panel that can be used in the display device of one embodiment of the present invention. FIG. 5A is a cross-sectional view along cutting lines X1-X2, X3-X4, and X9-X10 and of a pixel in FIG. 4A, and FIG. 5B is a circuit diagram illustrating a structure of a pixel circuit $530(i,j)$.

Figure 6:
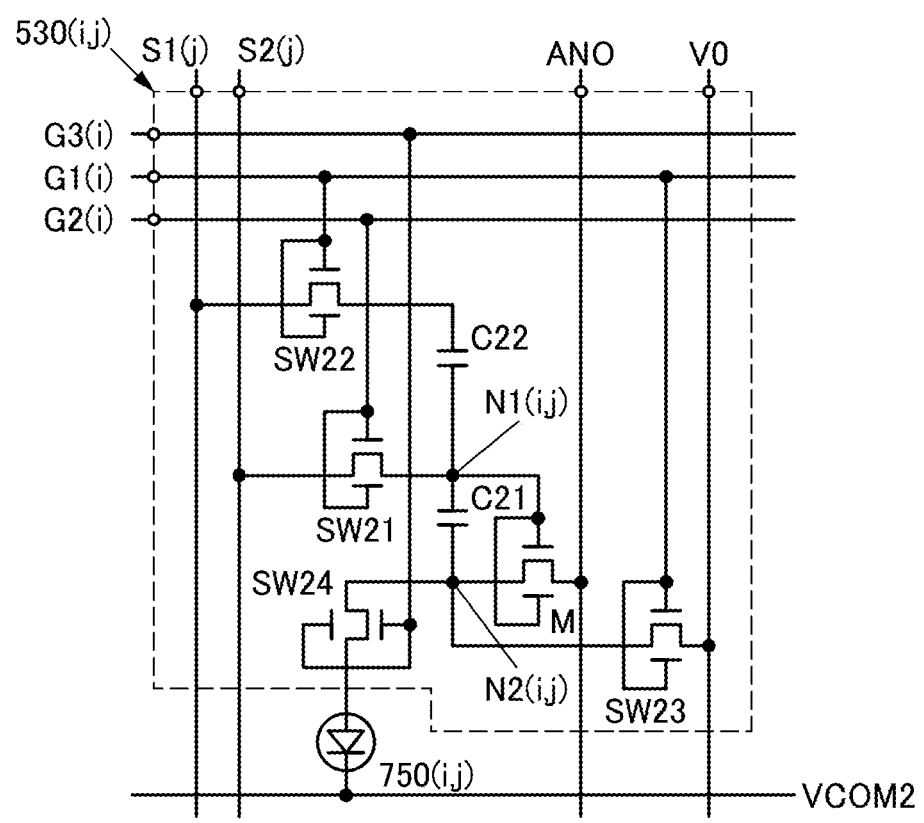
FIG. 6 is a diagram illustrating a structure of a display panel according to an embodiment.
Figure 7:
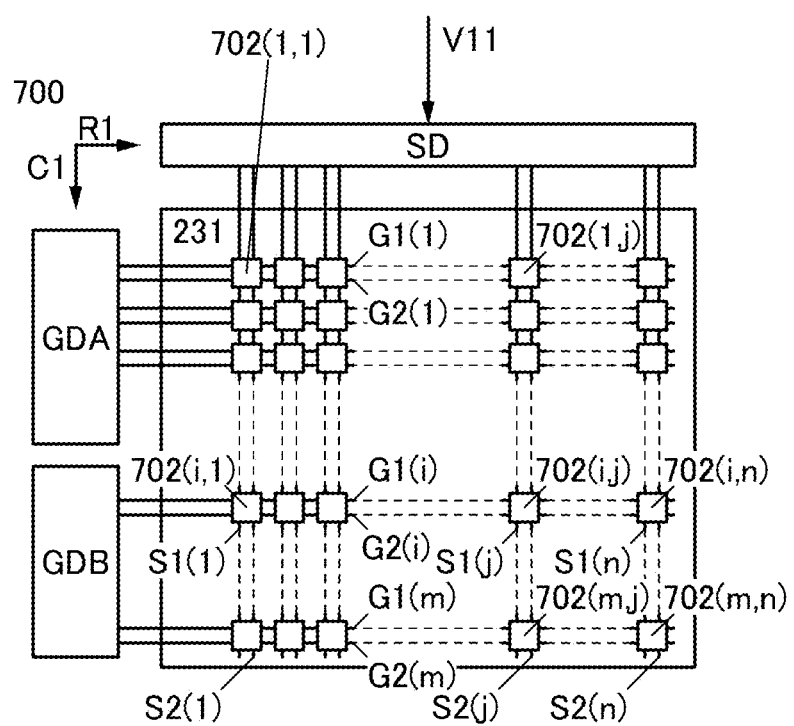
FIG. 7 is a block diagram illustrating a structure of a display panel according to an embodiment.

FIG. 6 is a diagram illustrating a structure of the pixel circuit and a display element that can be used in the display device of one embodiment of the present invention. FIG. 7 is a diagram illustrating the structure of the display panel that can be used in the display device of one embodiment of the present invention.

Note that in this specification, an integer variable of 1 or more is sometimes used in reference numerals. For example, (p) where p is an integer variable of 1 or more is sometimes used in part of a reference numeral that specifies any of p components at a maximum. As another example, (m,n) where m and n are each an integer variable of 1 or more is sometimes used in part of a reference numeral that specifies any of m×n components at a maximum.

<Structure Example 1 of Display Panel>

The display panel 700 described in this embodiment includes the display region 231 (see FIG. 7). Note that a driver circuit GD can be used in the display panel.

<<Structure Example 1 of Display Region 231>>

The display region 231 includes a scan line $G1(i)$, a scan line $G2(i)$, a signal line $S1(j)$, a signal line $S2(j)$, and a pixel 702$(i,j)$.

<<Structure Example 1 of Pixel 702$(i,j)$>>

The pixel 702$(i,j)$ includes a display element 750$(i,j)$ and the pixel circuit 530$(i,j)$ (see FIG. 5A).

<<Structure Example of Display Element 750$(i,j)$>>

The display element 750$(i,j)$ is electrically connected to the pixel circuit 530$(i,j)$ (see FIG. 5A and FIG. 5B).

An element that controls light reflection, light transmission, or light emission can be used as the display element, for example. Specifically, an electro-optic element or a light-emitting element can be used as the display element.

<<Structure Example 1 of Pixel Circuit 530$(i,j)$>>

The pixel circuit 530$(i,j)$ is electrically connected to the scan line $G1(i)$, the scan line $G2(i)$, the signal line $S1(j)$, and the signal line $S2(j)$ (see FIG. 5B).

Thus, a first selection signal can be supplied to the first scan line $G1(i)$. Alternatively, a second selection signal can be supplied to the second scan line $G2(i)$. Alternatively, the pixel 702$(i,j)$ can be driven using the first selection signal or the second selection signal. As a result, a novel display panel that is highly convenient, useful, or reliable can be provided.

A switch, a transistor, a diode, a resistor, an inductor, a capacitor, or the like can be used in the pixel circuit 530$(i,j)$, for example. Specifically, a transistor can be used as a switch.

For example, in the case where a plurality of transistors are used in the pixel circuit, a semiconductor film of one transistor can be formed in the step of forming a semiconductor film of another transistor.

<<Structure Example 2 of Pixel 702$(i,j)$>>

In the pixel 702$(i,j)$, a liquid crystal element can be used as the display element 750$(i,j)$.

<<Structure Example 2 of Pixel Circuit 530$(i,j)$>>

The pixel circuit 530$(i,j)$ includes a capacitor C11, a switch SW11, and a node $N1(i,j)$ (see FIG. 5B). Note that the display panel 700 includes a conductive film VCOM1. The display element 750$(i,j)$ is electrically connected to the conductive film VCOM1.

The switch SW11 includes a first terminal electrically connected to the signal line $S2(j)$ and a second terminal electrically connected to a first electrode of the display element 750$(i,j)$. Note that the switch SW11 has a function of switching between a conducting state and a non-conducting state on the basis of a selection signal.

The capacitor C11 includes a first electrode electrically connected to the second terminal of the switch SW11 and a second electrode electrically connected to a conductive film CSCOM.

The display element 750$(i,j)$ performs display on the basis of a potential VN of the node $N1(i,j)$.

<<Structure Example 3 of Pixel Circuit 530$(i,j)$>>

The pixel circuit 530$(i,j)$ includes the capacitor C11, a capacitor C12, the switch SW11, a switch SW12, and the node $N1(i,j)$.

The switch SW11 includes a first terminal electrically connected to the signal line $S2(j)$ and a second terminal electrically connected to the first electrode of the display element 750$(i,j)$. Note that the switch SW11 has a function of switching between a conducting state and a non-conducting state on the basis of the second selection signal.

The capacitor C11 includes a first electrode electrically connected to the second terminal of the switch SW11 and a second electrode electrically connected to the conductive film CSCOM.

The switch SW12 includes a first terminal electrically connected to the signal line $S1(j)$. Note that the switch SW12 has a function of switching between a conducting state and a non-conducting state on the basis of the first selection signal.

The capacitor C12 includes a first electrode electrically connected to a second terminal of the switch SW12 and a second electrode electrically connected to the second terminal of the switch SW11.

The display element 750$(i,j)$ performs display on the basis of the potential VN of the node $N1(i,j)$.

When the switch SW11 is in a non-conducting state, the switch SW12 can change from a non-conducting state to a conducting state. When the switch SW11 is in a non-conducting state, the switch SW12 can change from a conducting state to a non-conducting state.

[First Step]

In a first step, the switch SW11 and the switch SW12 are brought into a conducting state. For example, the first selection signal is supplied to the scan line $G1(i)$, and the second selection signal is supplied to the scan line $G2(i)$.

Furthermore, an image signal is supplied to the capacitor C12. The image signal is supplied using, for example, a potential difference between a potential supplied through the signal line $S1(j)$ and a potential supplied through the signal line $S2(j)$.

[Second Step]

In a second step, the switch SW12 is brought into a conducting state while the switch SW11 is kept in a non-conducting state. For example, a batch selection signal is supplied to the scan line $G1(i)$.

Furthermore, a predetermined potential is supplied to a signal line S1($i$) to offset the potential of the node N1($i,j$) through the capacitor C12.

[Third Step]

In a third step, display is performed using the display element 750($i,j$) on the basis of the potential of the node N1($i,j$) while the switch SW11 and the switch SW12 are kept in a non-conducting state.

In this manner, the potential of the node N1($i,j$) can be controlled using the switch SW11 and the switch SW12. Alternatively, the potential of the node N1($i,j$) can be controlled using the switch SW11, and the potential of the node N1($i,j$) can be changed using the switch SW12. Alternatively, the changing potential can be supplied to the display element 750($i,j$). Alternatively, display can be performed on the basis of the changing potential. Alternatively, the display of the display element 750($i,j$) can be changed. Alternatively, the operation of the display element 750($i,j$) can be emphasized. Alternatively, the response of the display element 750(0 can be made faster. As a result, a novel display panel that is highly convenient, useful, or reliable can be provided.

Alternatively, a high voltage can be supplied to the display element 750($i,j$). Alternatively, a high electric field can be applied to a layer 753 containing a liquid crystal material (which will be described later) in the display element 750($i,j$). Alternatively, the alignment of a polymer-stabilized liquid crystal material can be controlled. As a result, a novel input/output device that is highly convenient, useful, or reliable can be provided.

<<Structure Example 3 of Pixel 702($i,j$)>>

In the pixel 702($i,j$), a light-emitting element can be used as the display element 750(0 (see FIG. 6). For example, an organic EL element can be used as the display element 750. Note that the display panel 700 includes a conductive film VCOM2. The display element 750($i,j$) is electrically connected to the conductive film VCOM2.

<<Structure Example 4 of Pixel Circuit 530($i,j$)>>

The pixel circuit 530($i,j$) includes a transistor M, a capacitor C21, a switch SW21, the node N1($i,j$), a capacitor C22, and a switch SW22 (see FIG. 6). The pixel circuit 530($i,j$) also includes a node N2($i,j$), a switch SW23, and a switch SW24.

The transistor M includes a first electrode electrically connected to a conductive film ANO.

The capacitor C21 includes a first electrode electrically connected to a gate electrode of the transistor M and a second electrode electrically connected to a second electrode of the transistor M.

The switch SW21 includes a first terminal electrically connected to the signal line S2($j$) and a second terminal electrically connected to the gate electrode of the transistor M. Note that the switch SW21 has a function of switching between a conducting state and a non-conducting state on the basis of the second selection signal.

The capacitor C22 includes a first electrode electrically connected to the gate electrode of the transistor M.

The switch SW22 includes a first terminal electrically connected to the signal line S1(1) and a second terminal electrically connected to a second electrode of the capacitor C22. Note that the switch SW22 has a function of switching between a conducting state and a non-conducting state on the basis of the first selection signal.

The switch SW23 includes a first terminal electrically connected to the second electrode of the transistor M and a second terminal electrically connected to a conductive film VO. Note that the switch SW23 has a function of switching between a conducting state and a non-conducting state on the basis of the first selection signal.

The switch SW24 includes a first terminal electrically connected to the second electrode of the transistor M and a second terminal electrically connected to the display element 750($i,j$). The switch SW24 has a function of switching between a conducting state and a non-conducting state on the basis of a third selection signal. Note that the display panel 700 includes a scan line G3($i$). The pixel circuit 530($i,j$) is electrically connected to the scan line G3($i$).

When the switch SW21 is in a non-conducting state, the switch SW22 can change from a non-conducting state to a conducting state. When the switch SW21 is in a non-conducting state, the switch SW22 can change from a conducting state to a non-conducting state.

The display element 750($i,j$) performs display on the basis of the potential VN of the node N1($i,j$).

In this manner, the potential of the node N1($i,j$) can be controlled using the switch SW21 and the switch SW22. Alternatively, the potential of the node N1($i,j$) can be controlled using the switch SW21, and the potential of the node N1($i,j$) can be changed using the switch SW22. Alternatively, the changing potential can be supplied to the display element 750($i,j$). Alternatively, display can be performed on the basis of the changing potential. Alternatively, the display of the display element 750($i,j$) can be changed. Alternatively, the operation of the display element 750($i,j$) can be emphasized. Alternatively, the response of the display element 750($i,j$) can be made faster. As a result, a novel display panel that is highly convenient, useful, or reliable can be provided.

<<Structure Example 2 of Display Region 231>>

The display region 231 includes a group of pixels 702($i$,1) to 702($i,n$) and a different group of pixels 702(1,$j$) to 702($m,j$) (see FIG. 7).

Although not illustrated, the display region 231 includes the conductive film CSCOM and the conductive film VCOM1.

The group of pixels 702($i$,1) to 702($i,n$) is arranged in a row direction (the direction indicated by an arrow R1 in the drawing), and the group of pixels 702($i$,1) to 702($i,n$) includes the pixel 702($i,j$).

The different group of pixels 702(1,$j$) to 702($m,j$) is arranged in a column direction intersecting the row direction (the direction indicated by an arrow C1 in the drawing), and the different group of pixels 702(1,$j$) to 702($m,j$) includes the pixel 702($i,j$).

The scan line G1($i$) is electrically connected to the group of pixels 702($i$,1) to 702($i,n$), and the scan line G2($i$) is electrically connected to the group of pixels 702($i$,1) to 702($i,n$).

The signal line S1($j$) is electrically connected to the different group of pixels 702(1,$j$) to 702($m,j$), and the signal line S2($j$) is electrically connected to the different group of pixels 702(1,$j$) to 702($m,j$).

Thus, image data can be concurrently supplied to a plurality of pixels. As a result, a novel display panel that is highly convenient, useful, or reliable can be provided.

<<Driver Circuit GDA and Driver Circuit GDB>>

A driver circuit GDA and a driver circuit GDB can be used as the driver circuit GD. For example, the driver circuit GDA and the driver circuit GDB each have a function of supplying a selection signal in response to a control signal SP.

Specifically, the driver circuit GDA and the driver circuit GDB each have a function of supplying a selection signal to one scan line at a frequency of higher than or equal to 30 Hz, preferably higher than or equal to 60 Hz, in response to the control signal SP Accordingly, a moving image can be smoothly displayed.

Alternatively, the driver circuit GDA and the driver circuit GDB each have a function of supplying a selection signal to one scan line at a frequency of lower than 30 Hz, preferably lower than 1 Hz, further preferably less than once a minute, in response to the control signal SP Accordingly, a still image in which flickering is reduced can be displayed.

In the case where a plurality of driver circuits are included, for example, the frequency at which the driver circuit GDA supplies a selection signal and the frequency at which the driver circuit GDB supplies a selection signal can be made different from each other. Specifically, a selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, display can be performed at a frame frequency of higher than or equal to 1 Hz and lower than or equal to 120 Hz. Alternatively, display can be performed at a frame frequency of 120 Hz by a progressive method.

<<Driver Circuit SD>>

A driver circuit SD has a function of generating an image signal on the basis of data V11 and a function of supplying the image signal to a pixel circuit electrically connected to one display element (see FIG. 7).

A variety of sequential circuits, such as a shift register, can be used as the driver circuit SD, for example.

For example, an integrated circuit formed on a silicon substrate can be used as the driver circuit SD.

The integrated circuit can be connected to a terminal by a COG (Chip on glass) method or a COF (Chip on film) method, for example. Specifically, an anisotropic conductive film can be used to connect the integrated circuit to a terminal.

Note that this embodiment can be combined with other embodiments in this specification as appropriate.

Embodiment 3

In this embodiment, a structure of a pixel that can be used in the display device of one embodiment of the present invention will be described with reference to FIG. 4 to FIG. 9.

Figure 8A:
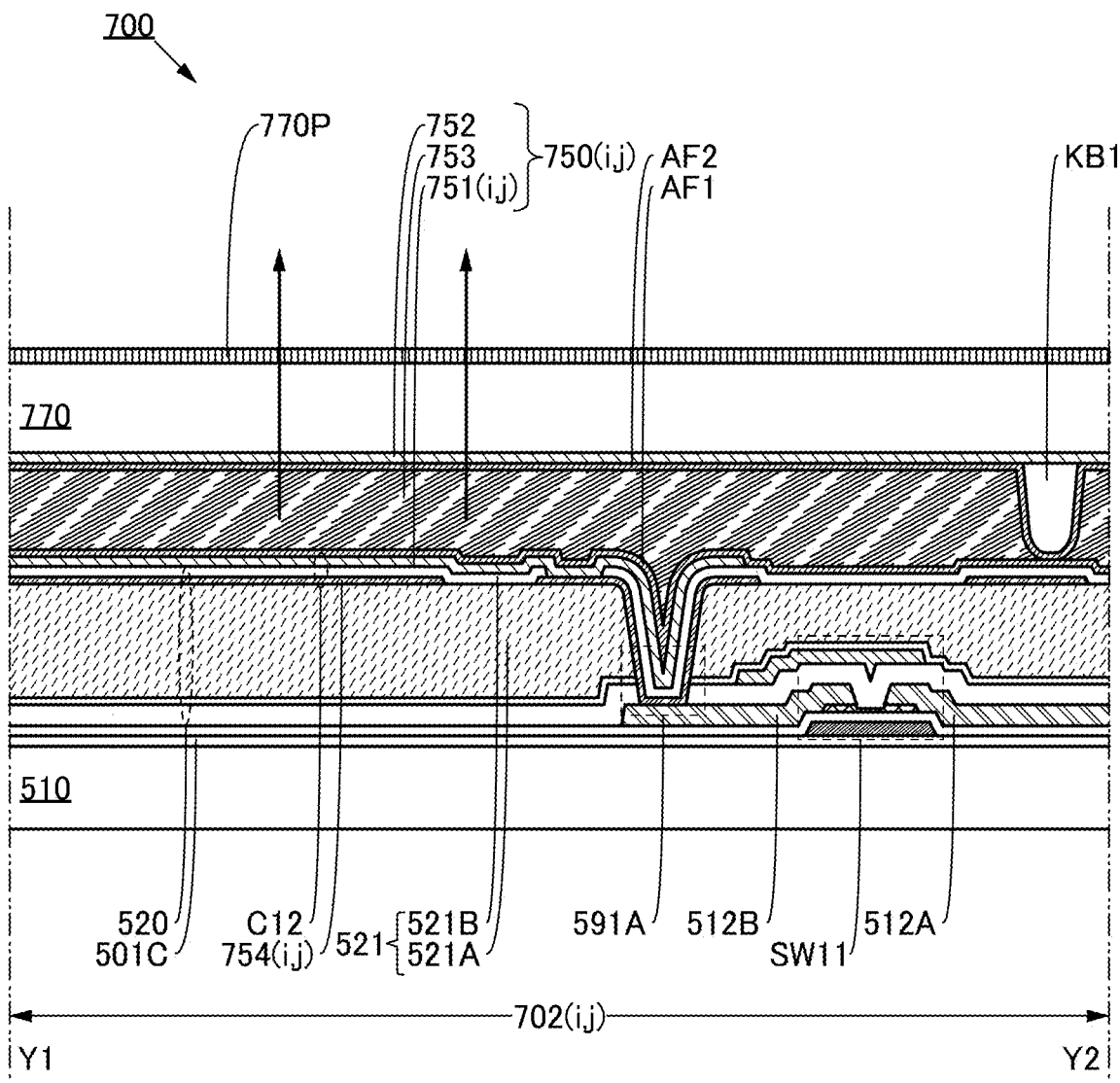
FIG. 8A and FIG. 8B are cross-sectional views illustrating a structure of a display panel according to an embodiment.
Figure 8B:
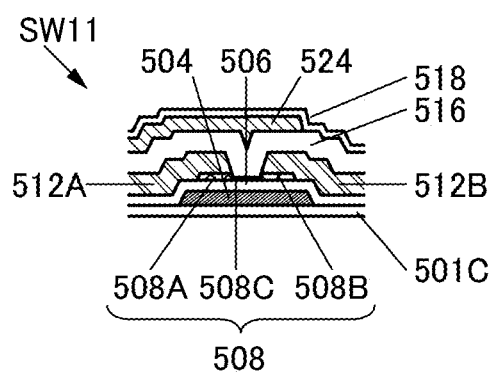

FIG. 8 illustrates a structure of the display panel that can be used in the display device of one embodiment of the present invention. FIG. 8A is a cross-sectional view of the pixel 702($i,j$) along a cutting line Y1-Y2 in FIG. 4B, and FIG. 8B is a cross-sectional view illustrating part of FIG. 8A.

Figure 9A:
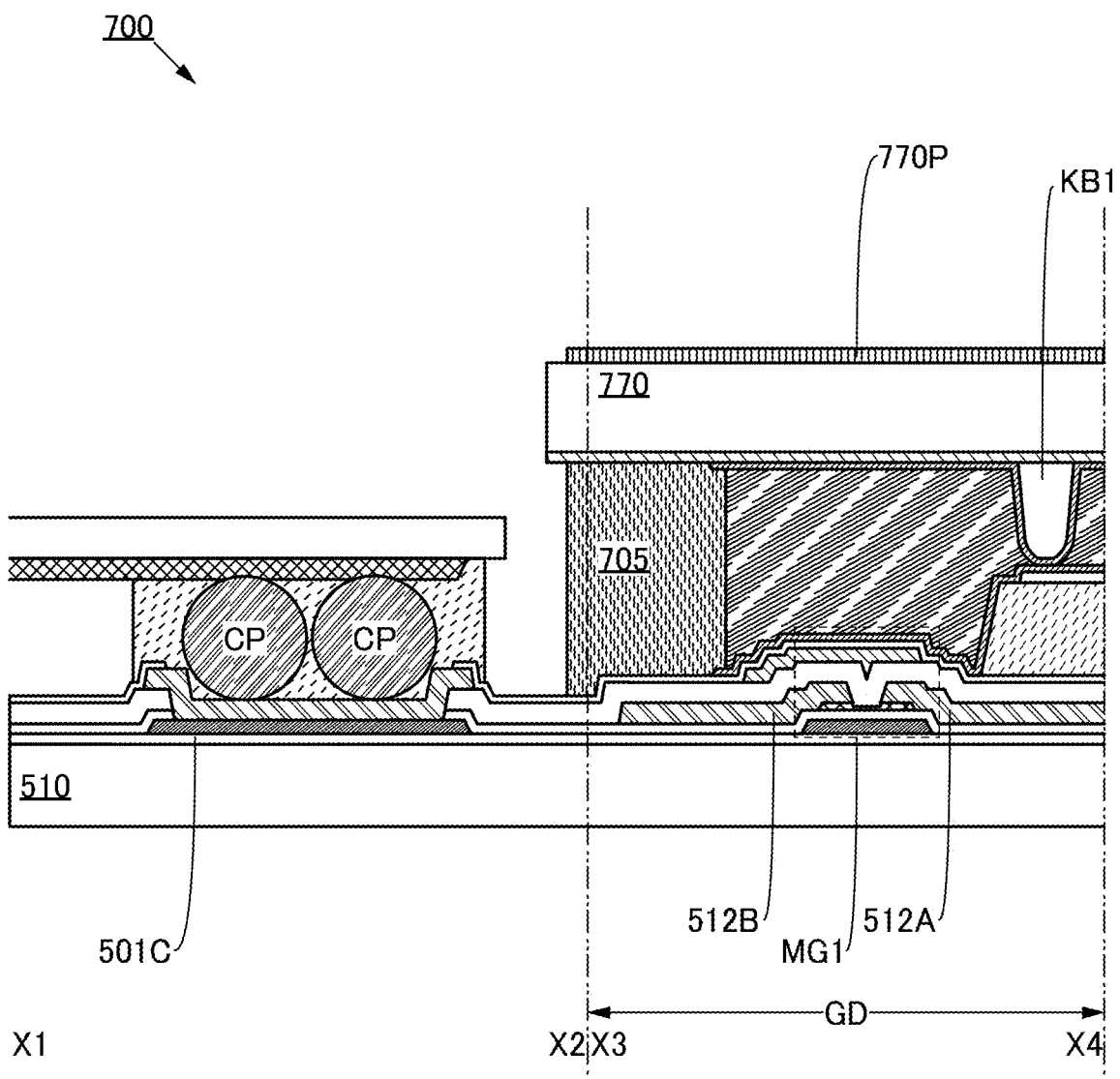
FIG. 9A and FIG. 9B are cross-sectional views illustrating a structure of a display panel according to an embodiment.
Figure 9B:
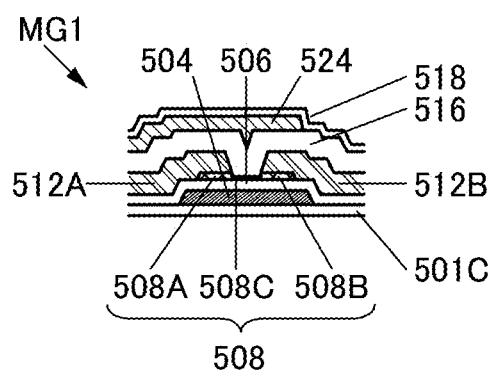

FIG. 9 illustrates the structure of the display panel that can be used in the display device of one embodiment of the present invention. FIG. 9A is a cross-sectional view along cutting lines X1-X2 and X3-X4 in FIG. 4A, and FIG. 9B is a cross-sectional view illustrating part (a transistor MG1) of FIG. 9A.

<Structure Example 1 of Display Panel 700>

The display panel described in this embodiment includes a functional layer 520 (see FIG. 5A).

<<Functional Layer 520>>

The functional layer 520 includes the driver circuit GD and the pixel circuit 530(0 described in Embodiment 2. Note that the functional layer 520 is provided with an opening portion 591A, and the pixel circuit 530($i,j$) is electrically connected to the display element 750(0 in the opening portion 591A.

Accordingly, a semiconductor film used for a transistor of the driver circuit GD can be formed in a step of forming a semiconductor film used for the transistor of the pixel circuit 530($i,j$). Alternatively, the number of components can be reduced. As a result, a novel display panel that is highly convenient, useful, or reliable can be provided.

<<Structure Example of Transistor>>

A bottom-gate transistor, a top-gate transistor, or the like can be used in the driver circuit GD and the pixel circuit 530($i,j$), for example (see FIG. 8 and FIG. 9).

A transistor used as the switch SW11 includes a semiconductor film 508, a conductive film 504, a conductive film 512A, and a conductive film 512B (see FIG. 8B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is positioned between a region of the conductive film 524 and the conductive film 504. The conductive film 524 has a function of a second gate electrode. The conductive film 524 can be electrically connected to the conductive film 504, for example. Note that the conductive film 524 can be used as the scan line G2($i$).

Note that the semiconductor film used for the transistor of the driver circuit GD can be formed in a step of forming the semiconductor film used for the transistor of the pixel circuit 530($i,j$).

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. Alternatively, for example, the driving capability can be higher than that of a transistor using hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor using hydrogenated amorphous silicon for the semiconductor film 508.

Alternatively, the temperature required for fabrication of the transistor can be lower than that required for a transistor using single crystal silicon, for example.

Alternatively, the semiconductor film used for the transistor of the driver circuit can be formed in the same step as the semiconductor film used for the transistor of the pixel circuit. Alternatively, the driver circuit can be formed over the same substrate where the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a display panel using hydrogenated amorphous silicon for the semiconductor film 508. Alternatively, for example, a display panel having less display unevenness than a display panel using polysilicon for the semiconductor film 508 can be provided. Alternatively, for example, smart glasses or a head-mounted display can be provided.

<<Structure Example 2 of Semiconductor Film 508>>

For example, a metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Thus, cumulative fatigue of the display device user can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon for a semiconductor film can be used, for example. Specifically, a transistor using an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing tantalum and nitrogen is positioned between a region of the film containing copper and the insulating film 506.

A stacked film in which a 400-nm-thick film containing silicon and nitrogen and a 200-nm-thick film containing silicon, oxygen, and nitrogen are stacked can be used as the insulating film 506, for example. Note that the film containing silicon, oxygen, and nitrogen is positioned between a region of the film containing silicon and nitrogen and the semiconductor film 508.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

Accordingly, flickering can be inhibited. Alternatively, power consumption can be reduced. Alternatively, a moving image with quick movements can be smoothly displayed. Alternatively, a photograph and the like can be displayed with a wide range of grayscale. As a result, a novel display panel that is highly convenient, useful, or reliable can be provided.

<<Structure Example 3 of Semiconductor Film 508>>

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

<<Structure Example 1 of Capacitor>>

A capacitor includes one conductive film, a different conductive film, and an insulating film. The insulating film includes a region positioned between the one conductive film and the different conductive film.

For example, the conductive film 504, the conductive film 512A, and the insulating film 506 can be used for the capacitor.

The capacitor C12 includes a conductive film 754$(i,j)$, an electrode 751$(i,j)$, and an insulating film 521B (see FIG. 8A).

<<Structure Example 1 of Functional Layer 520>>

The functional layer 520 includes an insulating film 521A, an insulating film 518, an insulating film 516, the insulating film 506, an insulating film 501C, and the like (see FIG. 8A).

The insulating film 521A includes a region positioned between the pixel circuit 530$(i,j)$ and the display element 750$(i,j)$. Note that the pixel circuit 530$(i,j)$ includes the switch SW11, for example.

The insulating film 518 includes a region positioned between the insulating film 521A and the insulating film 501C.

The insulating film 516 includes a region positioned between the insulating film 518 and the insulating film 501C.

The insulating film 506 includes a region positioned between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Alternatively, a photosensitive material may be used. Thus, the insulating film 521 can eliminate a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

<<Structure Example 2 of Functional Layer 520>>

The functional layer 520 includes a conductive film, a wiring, and a terminal. A material having conductivity can be used for the wiring, an electrode, the terminal, the conductive film, and the like.

<<Wiring and the Like>>

For example, an inorganic conductive material, an organic conductive material, a metal, a conductive ceramic, or the like can be used for the wiring and the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring and the like. Alternatively, an alloy containing the above-described metal element, or the like can be used for the wiring and the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring and the like.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring and the like. Specifically, a nanowire containing silver can be used.

Specifically, a conductive polymer can be used for the wiring and the like.

Note that a terminal 519B can be electrically connected to a flexible printed circuit FPC1 with the use of a conductive material CP, for example (see FIG. 5A). Specifically, the terminal 519B can be electrically connected to the flexible printed circuit FPC1 with the use of the conductive material CP <Structure Example 2 of Display Panel 700>

The display panel 700 includes a base material 510, a base material 770, and a sealant 705 (see FIG. 8A and FIG. 9A).

<<Base Material 510 and Base Material 770>>

A material having a light-transmitting property can be used for the base material 510 or the base material 770.

For example, a flexible material can be used for the base material 510 or the base material 770. Thus, a flexible display panel can be provided.

For example, a material with a thickness of less than or equal to 0.7 mm and greater than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be fabricated.

For the base material 510 or the base material 770, an organic material, an inorganic material, a composite material of an organic material and an inorganic material, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate or a polycrystalline semiconductor substrate of silicon or silicon carbide, a compound semiconductor substrate of silicon germanium or the like, an SOI substrate, or the like can be used as the base material 510 or the base material 770. Thus, a semiconductor element can be formed on the base material 510 or the base material 770.

For example, an organic material such as resin, a resin film, or plastic can be used for the base material 510 or the base material 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. Alternatively, for example, the frequency of occurrence of breakage or the like due to dropping can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Alternatively, diffusion of impurities contained in glass or a resin can be prevented. Alternatively, diffusion of impurities that pass through a resin can be prevented.

Furthermore, paper, wood, or the like can be used for the base material 510 or the base material 770.

For example, a material having heat resistance high enough to withstand heat treatment in the fabrication process can be used for the base material 510 or the base material 770. Specifically, a material having heat resistance to heat applied in the fabrication process of directly forming the transistor, the capacitor, or the like can be used for the base material 510 or the base material 770.

For example, it is possible to employ a method in which an insulating film, a transistor, a capacitor, or the like is formed on a substrate that is for use in the process and has heat resistance to heat applied in the fabrication process, and the formed insulating film, transistor, capacitor, or the like is transferred to, for instance, the base material 510 or the base material 770. Accordingly, an insulating film, a transistor, a capacitor, or the like can be formed on a flexible substrate, for example.

<<Sealant 705>>

The sealant 705 includes a region positioned between the functional layer 520 and the base material 770 and has a function of attaching the functional layer 520 and the base material 770 together (see FIG. 9A).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<Structure Example 3 of Display Panel 700>

The display panel 700 includes a structure body KB1, a functional film 770P, or the like (see FIG. 8A). Note that a coloring film, a light-blocking film, or the like can be used between the functional layer 520 and the base material 770.

<<Structure Body KB1>>

The structure body KB1 includes a region positioned between the functional layer 520 and the base material 770. The structure body KB1 has a function of providing a predetermined space between the functional layer 520 and the base material 770.

<<Functional Film 770P and the Like>>

The functional film 770P includes a region overlapping with the display element 750(i,j).

An anti-reflection film, a polarizing film, a retardation film, a light diffusion film, a condensing film, or the like can be used as the functional film 770P, for example.

For example, an anti-reflection film with a thickness of less than or equal to 1 μm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P Furthermore, an antistatic film inhibiting the attachment of a dust, a water repellent film inhibiting the attachment of a stain, an oil repellent film inhibiting the attachment of a stain, an antireflective film (anti-reflection film), a non-glare film (anti-glare film), a hard coat film inhibiting generation of a scratch in use, a self-healing film inhibiting generation of a scratch in use, or the like can be used as the functional film 770P <<Structure Example of Display Element>>

An element that controls light reflection, light transmission, or light emission can be used as the display element, for example. Specifically, an electro-optic element or a light-emitting element can be used as the display element.

<<Structure Example 1 of Display Element 750(i,j)>>

A liquid crystal element, an electrophoretic element, an electronic ink, or the like can be used as the display element 750(i,j), for example (see FIG. 8A).

A reflective liquid crystal element can be used as the display element 750(i,j), for example. The use of a reflective display element can suppress power consumption of the display panel.

A transmissive liquid crystal element can be used as the display element 750(i,j), for example. The display panel 700 has a function of displaying an image by controlling transmission of light emitted by the light source 10.

<<Structure Example of Liquid Crystal Element>>

For example, a liquid crystal element that can be driven by a driving method such as an IPS (In-Plane-Switching) mode, a TN (Twisted Nematic) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, or an AFLC (AntiFerroelectric Liquid Crystal) mode can be used.

A liquid crystal element that can be driven by, for example, a vertical alignment (VA) mode, specifically, a driving method such as an MVA (Multi-Domain Vertical Alignment) mode, a PVA (Patterned Vertical Alignment) mode, an ECB (Electrically Controlled Birefringence) mode, a CPA (Continuous Pinwheel Alignment) mode, or an ASV (Advanced Super-View) mode can be used.

<<Structure Example 2 of Display Element 750(i,j)>>

The display element 750(i,j) includes the electrode 751(i,j), an electrode 752, and the layer 753 containing a liquid crystal material. The display element 750(i,j) also includes an alignment film AF1 and an alignment film AF2.

The electrode 751(i,j) is electrically connected to the pixel circuit 530(i,j) in the opening portion 591A.

The electrode 752 is provided such that an electric field controlling the alignment of the liquid crystal material is formed between the electrode 751(i,j) and the electrode 752.

<<Layer 753 Containing Liquid Crystal Material>>

The layer 753 containing a liquid crystal material includes a region positioned between the alignment film AF1 and the alignment film AF2.

For example, a liquid crystal material having a resistivity greater than or equal to $1.0 \times 10^{13}$ Ω·m, preferably greater than or equal to $1.0 \times 10^{14}$ Ω·cm, further preferably greater than or equal to $1.0 \times 10^{15}$ Ω·cm can be used for the layer 753 containing a liquid crystal material.

Thus, it is possible to make it difficult for current to flow through the layer 753 containing a liquid crystal material. Alternatively, an electric field applied to the layer 753 containing a liquid crystal material can be maintained. Alternatively, a variation in the transmittance of the display element 750(i,j) can be inhibited. Alternatively, flickering of the display element 750(i,j) can be inhibited. Alternatively, the rewriting frequency of the display element 750(i,j) can be reduced.

<<Structure Example 3 of Display Element 750(i,j)>>

The display element 750(i,j) described in this embodiment includes the electrode 751(i,j), the electrode 752, and the layer 753 containing a liquid crystal material. Furthermore, the alignment film AF1 and the alignment film AF2 are included (see FIG. 8A).

<<Structure Example of Alignment Film AF1 and Alignment Film AF2>>

The alignment film AF1 includes a region positioned between the electrode 751(i,j) and the layer 753 containing a liquid crystal material. The alignment film AF2 includes a region positioned between the electrode 752 and the layer 753 containing a liquid crystal material.

An alignment film for aligning liquid crystals in a substantially horizontal direction can be used as the alignment film AF1 and the alignment film AF2. For example, the pretilt angle can be set to approximately 2° to 5°.

Note that the alignment film AF2 is subjected to rubbing treatment so as to be antiparallel with the alignment film AF1. The thickness of the alignment film AF1 or the alignment film AF2 can be, for example, 70 nm.

<<Structure Example of Electrode 751(i,j) and Electrode 752>>

The electrode 752 is positioned such that an electric field crossing the layer 753 containing a liquid crystal material is formed between the electrode 751(i,j) and the electrode 752.

<<Structure Example 1 of Layer 753 Containing Liquid Crystal Material>>

The layer 753 containing a liquid crystal material scatters incident light $I_0$ with a first scattering intensity when the electric field is in a first state.

The layer 753 containing a liquid crystal material scatters the incident light $I_0$ with a second scattering intensity when the electric field is in a second state where the electric field is stronger than that in the first state. Note that the second scattering intensity is higher than the first scattering intensity.

Note that the thickness of the layer 753 containing a liquid crystal material can be, for example, greater than or equal to 2.5 μm and less than or equal to 6.0 μm.

<<Structure Example 2 of Layer 753 Containing Liquid Crystal Material>>

The layer 753 containing a liquid crystal material contains a liquid crystal material and a polymer material, and the layer 753 containing a liquid crystal material is stabilized with the polymer.

<<Structure Example of Liquid Crystal Material>>

For example, MDA-00-3506, a liquid crystal material produced by Merck, can be used for the layer 753 containing a liquid crystal material.

<<Structure Example of Polymer Material>>

The polymer material is a copolymer of a polyfunctional monomer and a monofunctional monomer.

<<Structure Example of Polyfunctional Monomer>>

The polyfunctional monomer has a phenyl benzoate skeleton. For example, diacrylate having a phenyl benzoate skeleton can be used as the polyfunctional monomer. Specifically, a material represented by the following structural formula (1) can be used as the polyfunctional monomer.

[Chemical Formula 1]

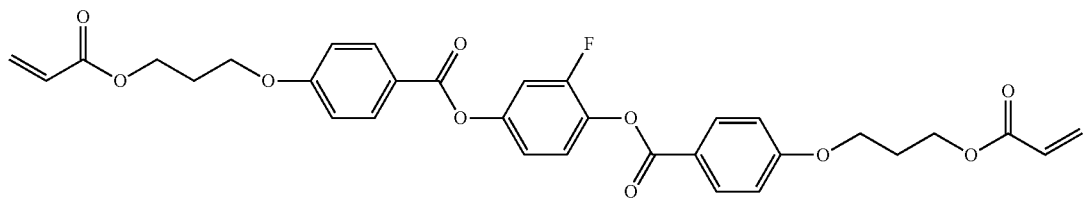

(1)

<<Structure Example of Monofunctional Monomer>>

The monofunctional monomer has a cyclohexylbenzene skeleton. For example, acrylate having a cyclohexyl skeleton can be used as the monofunctional monomer. Specifically, materials represented by the following structural formula (2) to structural formula (4) can be used as the monofunctional monomer.

[Chemical Formula 2]

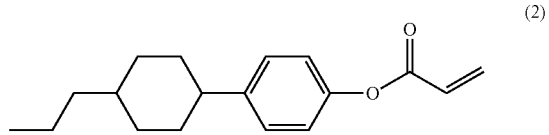

(2)

[Chemical Formula 3]

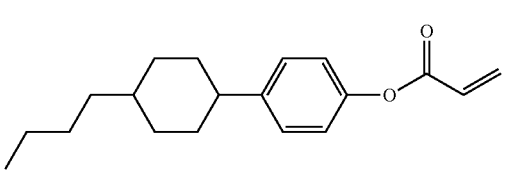

(3)

[Chemical Formula 4]

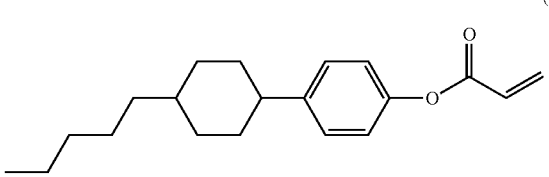

(4)

Thus, incident light can be scattered more strongly with a second electric field intensity that is higher than a first electric field intensity. Alternatively, the power consumed in the state of easily transmitting incident light can be reduced. As a result, a novel liquid crystal element that is highly convenient, useful, or reliable can be provided.

Note that phenyl benzoate has a structure represented by the structural formula (5), and cyclohexylbenzene has a structure represented by the structural formula (6). Both phenyl benzoate and cyclohexylbenzene may have a substituent.

[Chemical Formula 5]

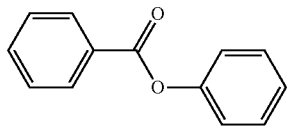

(5)

[Chemical Formula 6]

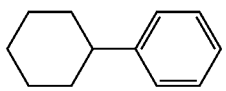

(6)

<Structure Example of Liquid Crystal Element>

The second scattering intensity of the liquid crystal element described in this embodiment is greater than or equal to 10 times the first scattering intensity.

Thus, the contrast between the state of transmitting incident light and the state of scattering incident light can be increased. As a result, a novel liquid crystal element that is highly convenient, useful, or reliable can be provided.

Note that this embodiment can be combined with other embodiments in this specification as appropriate.

Embodiment 4

In this embodiment, a structure of a display device of one embodiment of the present invention will be described with reference to FIG. 10.

FIG. 10 illustrates a structure of the display device of one embodiment of the present invention. FIG. 10A is a block diagram of the display device of one embodiment of the present invention, and FIG. 10B1 to FIG. 10B3 are projection views each illustrating the appearance of the display device of one embodiment of the present invention.

<Structure Example 1 of Display Device>

Figure 10A:
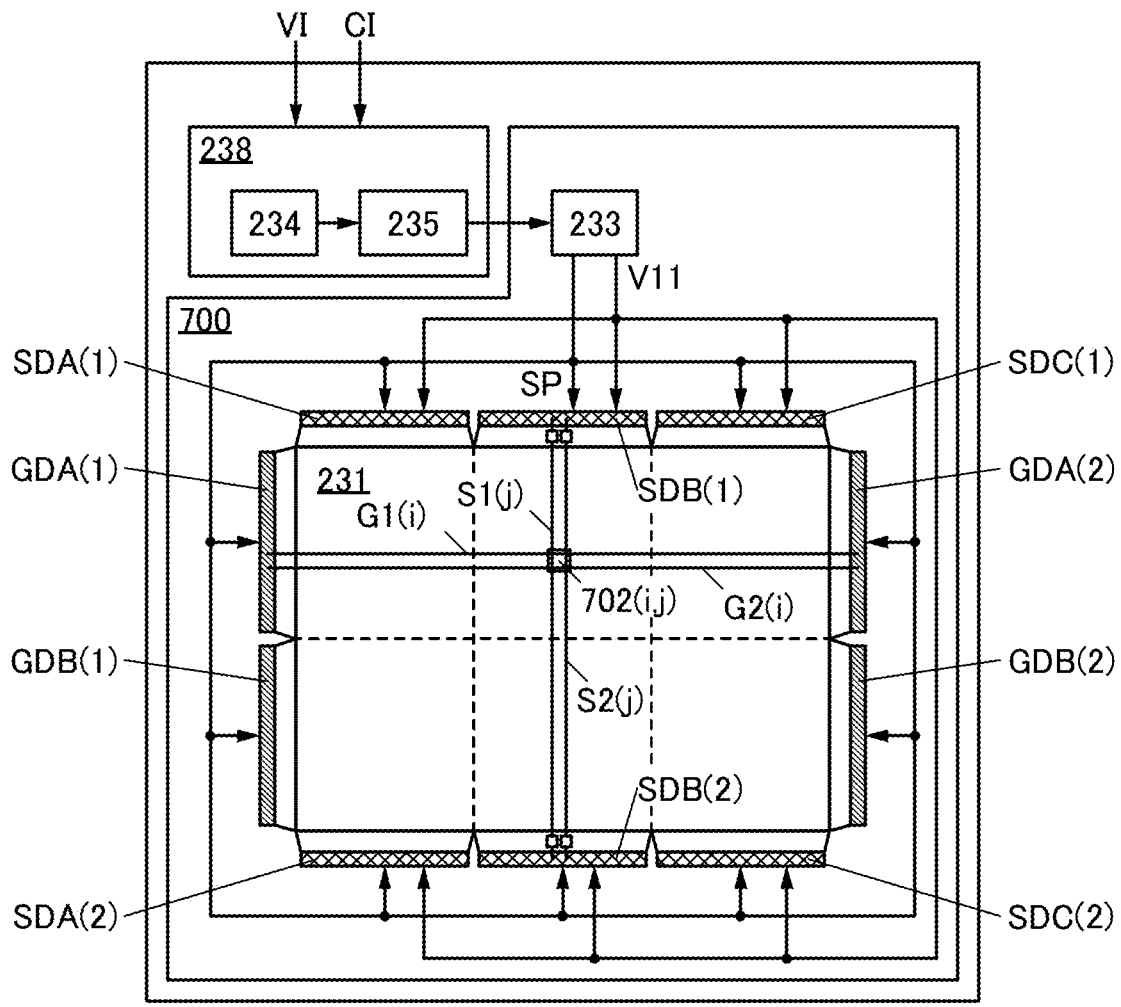
Figure 10A:
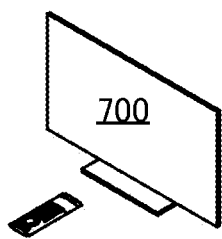
Figure 10A:
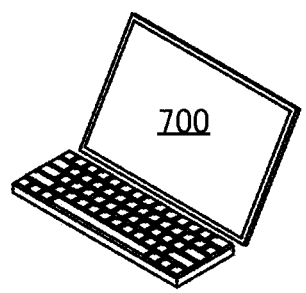
Figure 10A:
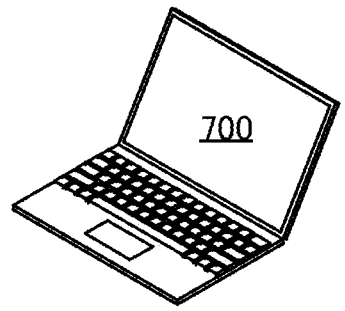

The display device described in this embodiment includes the display panel 700 and a control portion 238 (see FIG. 10A).

<<Structure Example 1 of Control Portion 238>>

The control portion 238 is supplied with image information VI and control information CI. For example, a clock signal, a timing signal, or the like can be used as the control information CI.

The control portion 238 generates information V11 on the basis of the image information VI and generates the control signal SP on the basis of the control information CI. Furthermore, the control portion 238 supplies the information V11 and the control signal SP.

The information V11 includes a grayscale of 8 bits or more, preferably 12 bits or more, for example. In addition, a clock signal, a start pulse, or the like of a shift register used for a driver circuit can be used as the control signal SP, for example.

<<Structure Example 2 of Control Portion 238>>

For example, a decompression circuit 234 and an image processing circuit 235 can be used in the control portion 238.

<<Decompression Circuit 234>>

The decompression circuit 234 has a function of decompressing the image information VI supplied in a compressed state. The decompression circuit 234 includes a memory portion. The memory portion has a function of storing decompressed image information, for example.

<<Image Processing Circuit 235>>

The image processing circuit 235 includes a memory region, for example. The memory region has a function of storing information included in the image information VI, for example.

The image processing circuit 235 has a function of generating the information V11 by correcting the image information VI on the basis of a predetermined characteristic curve and a function of supplying the information V11, for example.

<<Structure Example 1 of Display Panel>>

The display panel 700 is supplied with the information V11 and the control signal SP. For example, a driver circuit can be used in the display panel 700. Specifically, the display panel 700 described in Embodiment 2 or Embodiment 3 can be used.

<<Driver Circuit>>

The driver circuit operates on the basis of the control signal SP. Using the control signal SP enables a synchronized operation of a plurality of driver circuits.

For example, a driver circuit GDA(1), a driver circuit GDA(2), a driver circuit GDB(1), and a driver circuit GDB(2) can be used in the display panel. Specifically, the driver circuit GDA(1), the driver circuit GDA(2), the driver circuit GDB(1), and the driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and a driver circuit SDC(2) can be used in the display panel. The driver circuit SDA(1), the driver circuit SDA(2), the driver circuit SDB(1), the driver circuit SDB(2), the driver circuit SDC(1), and the driver circuit SDC(2) are supplied with the control signal SP and the information V11 and capable of supplying an image signal.

<<Structure Example of Pixel 702(i,j)>>

The pixel 702(i,j) performs display on the basis of the information V11.

Thus, the image information can be displayed using the display element. As a result, a novel display device that is highly convenient, useful, or reliable can be provided. Alternatively, for example, a television receiver system (see FIG. 10B1), a video monitor (see FIG. 10B2), a laptop computer (see FIG. 10B3), or the like can be provided.

<<Structure Example 2 of Display Panel>>

For example, a control circuit 233 can be used in the display panel 700. Specifically, the control circuit 233 formed over a rigid substrate can be used in the display panel 700. The control circuit 233 formed over the rigid substrate can be electrically connected to the control portion 238 with the use of a flexible printed circuit.

<<Control Circuit 233>>

The control circuit 233 has a function of generating and supplying the control signal SP. For example, a clock signal, a timing signal, or the like can be used as the control signal SP Specifically, a timing controller can be used as the control circuit 233.

<Structure Example 2 of Display Device>

Figure 11A:
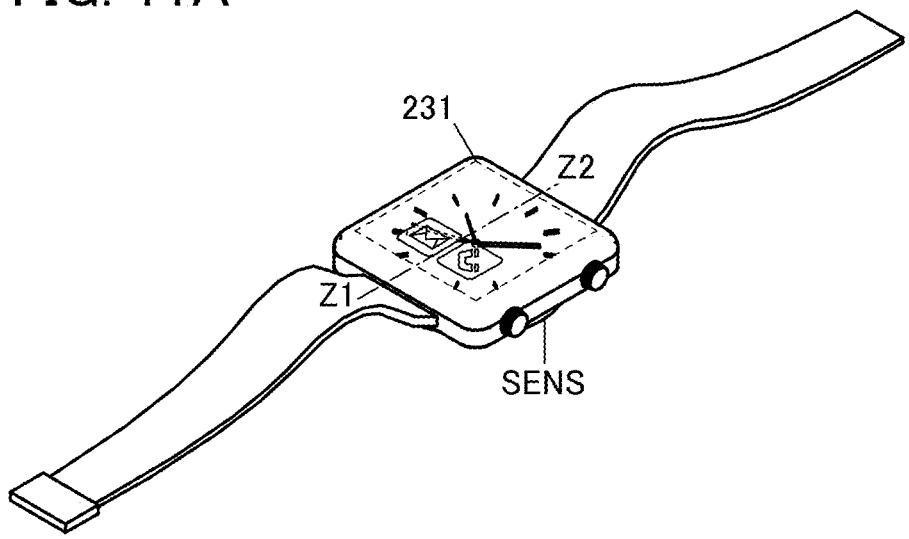
FIG. 11A to FIG. 11C are diagrams illustrating a structure of a display device according to an embodiment.
Figure 11B:
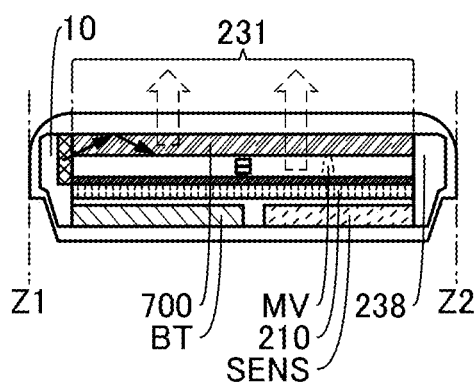

The display device described in this embodiment includes the display panel 700 and the control portion 238 (see FIG. 11A and FIG. 11B). The display device also includes the light source 10, an arithmetic device 210, a sensor SENS, a driving portion MV, and a battery BT. The display panel includes the display region 231.

For example, the display panel described in Embodiment 2 or Embodiment 3 can be used as the display panel 700.

<<Structure Example 1 of Light Source 10>>

The light source 10 is supplied with the control information CI. For example, a clock signal, a timing signal, or the like can be used as the control information CI.

The light source 10 includes a light-emitting element and a driver circuit. The light-emitting element is electrically connected to the driver circuit.

An LFD, an organic EL element, or the like can be used as the light source 10, for example. Specifically, a light-emitting element that emits white light can be used as the light source 10. Alternatively, a light-emitting element that emits blue light, a light-emitting element that emits green light, and a light-emitting element that emits red light can be used as the light source 10.

The driver circuit can simultaneously turn on the light-emitting element that emits blue light, the light-emitting element that emits green light, and the light-emitting element that emits red light. Alternatively, the light-emitting element that emits blue light, the light-emitting element that emits green light, and the light-emitting element that emits red light can be sequentially turned on.

<<Structure Example 2 of Light Source 10>>

Figure 11C:
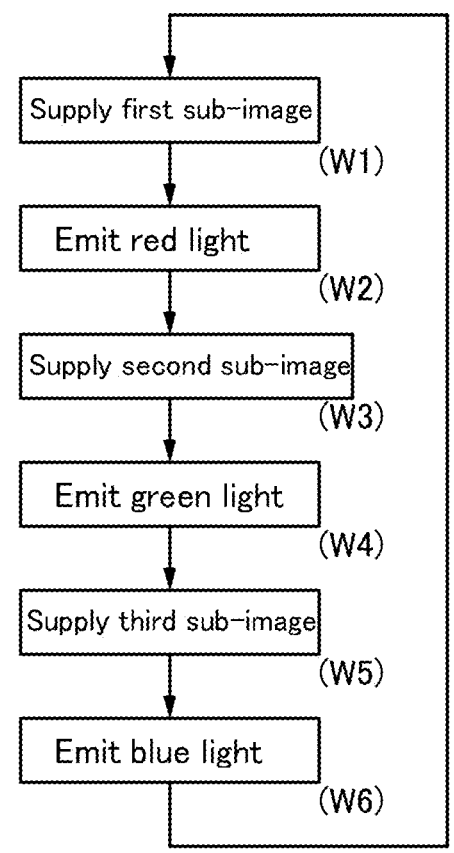

The light source 10 can display the image information VI on the basis of the control information CI by a field-sequential method, for example (see FIG. 11C).

[First Step]

As first sub-image information, a red component of predetermined image information is supplied, for example (see (W1) in FIG. 11C).

[Second Step]

The first sub-image information is displayed by emitting red light using the light source 10 (see (W2) in FIG. 11C).

[Third Step]

As second sub-image information, a green component of the predetermined image information is supplied, for example (see (W3) in FIG. 11C).

[Fourth Step]

The second sub-image information is displayed by emitting green light using the light source 10 (see (W4) in FIG. 11C).

[Fifth Step]

As third sub-image information, a blue component of the predetermined image information is supplied, for example (see (W5) in FIG. 11C).

[Sixth Step]

The third sub-image information is displayed by emitting blue light using the light source 10 (see (W6) in FIG. 11C).

<<Sensor SENS>>

The sensor SENS supplies sensing information DS. A pulse sensor, a temperature sensor, a pressure sensor, or the like can be used as the sensor SENS, for example.

<<Arithmetic Device 210>>

The arithmetic device 210 is supplied with the sensing information DS. The arithmetic device 210 generates the image information VI on the basis of the sensing information DS.

For example, the image information VI for displaying the user's pulse, body temperature, or the like can be generated on the basis of the sensing information DS. Alternatively, the image information VI for displaying atmospheric temperature, elevation, the depth of water, or the like can be generated on the basis of the sensing information DS.

The arithmetic device 210 supplies time information or the like.

<<Driving Portion MV>>

The driving portion MV includes an hour hand, a minute hand, a second hand, a motor, and a driver circuit, for example. The driving portion MV is supplied with time information or the like to display time or the like. For example, the hour hand, the minute hand, and the second hand can rotate at a predetermined speed. Furthermore, a pulse, body temperature, atmospheric temperature, elevation, the depth of water, or the like can be displayed.

Note that the display panel 700 is provided so as to be positioned between the user and the driving portion MV. Accordingly, the image information can be displayed in front of the hands such as the hour hand, the minute hand, and the second hand, for example. Alternatively, the image information VI can be superimposed on the hands such as the hour hand, the minute hand, and the second hand. Alternatively, the image information VI can be displayed without being blocked from view by the hands such as the hour hand, the minute hand, and the second hand.

<<Battery BT>>

The battery BT is electrically connected to the display panel 700, the control portion 238, the light source 10, the sensor SENS, the arithmetic device 210, and the driving portion MV. The battery BT supplies power.

Note that this embodiment can be combined with other embodiments in this specification as appropriate.

Embodiment 5

In this embodiment, a structure of an input/output device of one embodiment of the present invention will be described with reference to FIG. 12.

Figure 12:
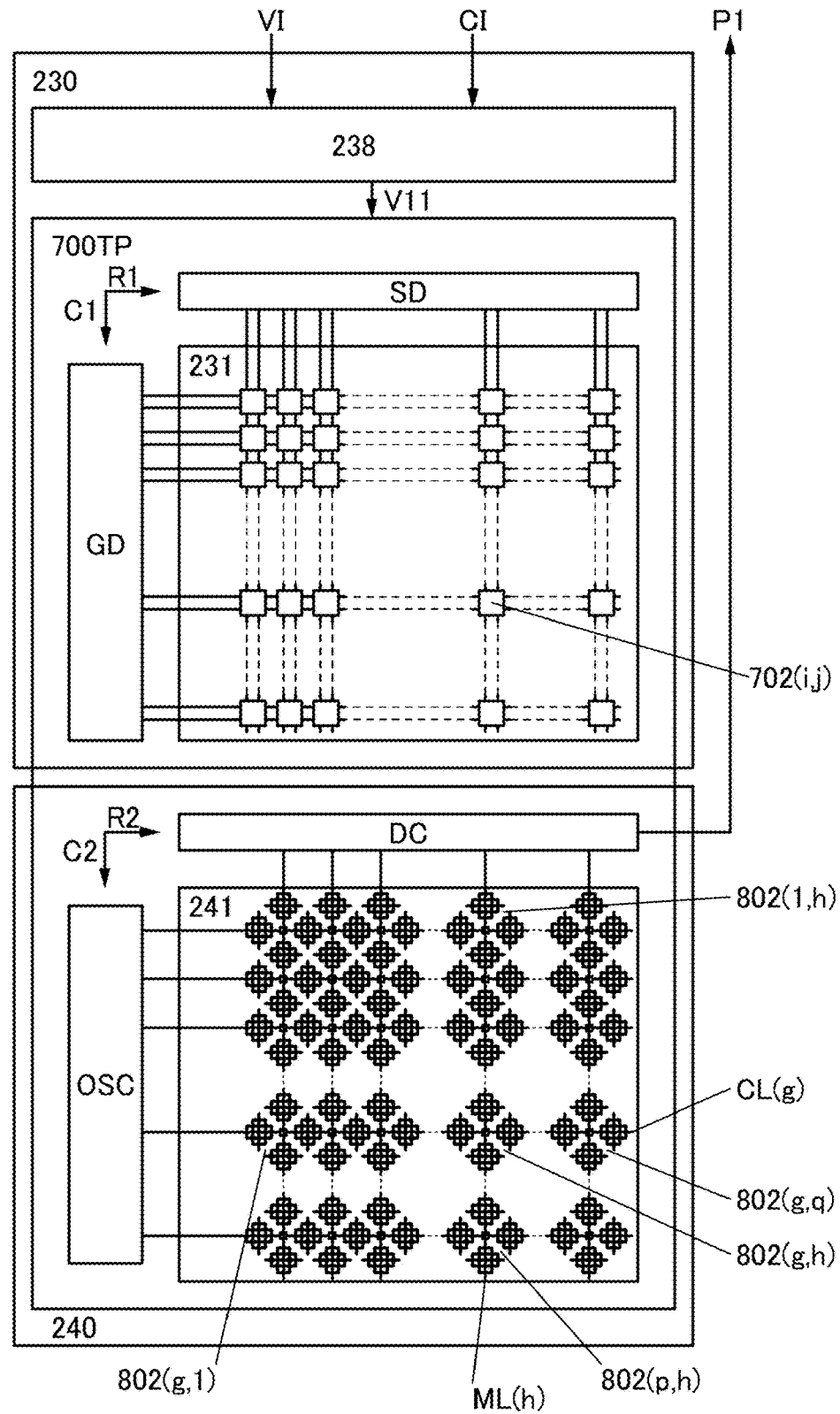
FIG. 12 is a block diagram illustrating a structure of an input/output device according to an embodiment.

FIG. 12 is a block diagram illustrating a structure of the input/output device of one embodiment of the present invention.

<Structure Example 1 of Input/Output Device>

The input/output device described in this embodiment includes an input portion 240 and a display portion 230 (see FIG. 12).

<<Display Portion 230>>

The display portion 230 includes a display panel. For example, the display panel 700 described in Embodiment 2 or Embodiment 3 can be used for the display portion 230. Note that a structure including the input portion 240 and the display portion 230 can be referred to as an input/output panel 700TP.

<<Structure Example 1 of Input Portion 240>>

The input portion 240 includes a sensing region 241. The input portion 240 has a function of sensing an object approaching the sensing region 241.

The sensing region 241 includes a region overlapping with the pixel 702(i,j).

Accordingly, an object approaching a region overlapping with the display portion can be sensed while image information is displayed using the display portion. Alternatively, a finger or the like that approaches the display portion can be used as a pointer to input position information. Alternatively, position information can be associated with image information displayed on the display portion. As a result, a novel input/output device that is highly convenient, useful, or reliable can be provided.

<<Structure Example 1 of Sensing Region 241>>

The sensing region 241 includes one or a plurality of sensors, for example. The sensing region 241 also includes a conductive film CL(g) and a conductive film ML(h).

The sensing region 241 includes a group of sensors 802(g,1) to 802(g,q) and a different group of sensors 802(1,h) to 802(p,h). Note that g is an integer greater than or equal to 1 and less than or equal to p, h is an integer greater than or equal to 1 and less than or equal to q, and p and q are each an integer greater than or equal to 1.

The group of sensors 802(g,1) to 802(g,q) includes a sensor 802(g,h) and is provided in a row direction (the direction indicated by an arrow R2 in the drawing). Note that the direction indicated by the arrow R2 may be the same as or different from the direction indicated by the arrow R1.

The different group of sensors 802(1,h) to 802(p,h) includes the sensor 802(g,h) and is provided in a column direction intersecting the row direction (the direction indicated by an arrow C2 in the drawing).

<<Sensor>>

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a senor that senses a stylus pen can be used in combination.

This allows determination of the kind of a pointer. Alternatively, different instructions can be associated with sensing information depending on the kind of a pointer that has been determined. Specifically, in the case where it is determined that a finger is used as a pointer, sensing information can be associated with a gesture. Alternatively, in the case where it is determined that a stylus pen is used as a pointer, sensing information can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

<<Structure Example 2 of Input Portion 240>>

The input portion 240 includes an oscillation circuit OSC and a sensing circuit DC (see FIG. 12).

The oscillation circuit OSC supplies a search signal to the sensor 802(g,h). For example, a rectangular wave, a sawtooth wave, a triangular wave, or a sine wave can be used as the search signal.

The sensor 802(g,h) generates and supplies a sensing signal that changes in accordance with the search signal and the distance to a pointer approaching the sensor 802(g,h).

The sensing circuit DC supplies input information in response to the sensing signal.

Accordingly, the distance from an approaching pointer to the sensing region 241 can be sensed. Alternatively, the position in the sensing region 241 where the pointer comes the closest can be sensed.

Note that this embodiment can be combined with other embodiments in this specification as appropriate.

Embodiment 6

In this embodiment, a structure of a data processing device of one embodiment of the present invention will be described with reference to FIG. 13 to FIG. 15.

Figure 13A:
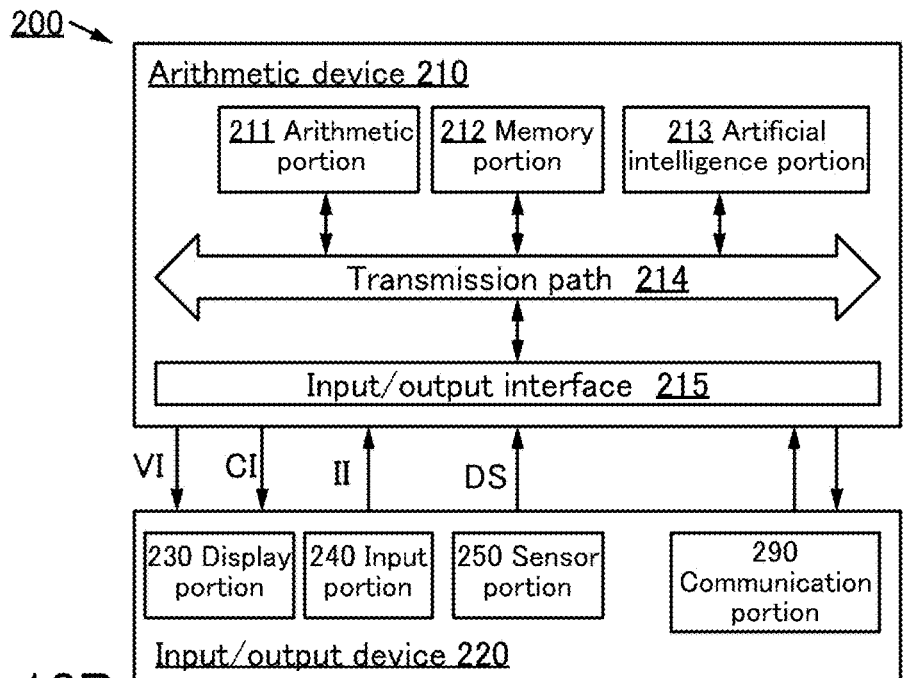
FIG. 13A to FIG. 13C are a block diagram and projection views each illustrating a structure of a data processing device according to an embodiment.
Figure 13B:
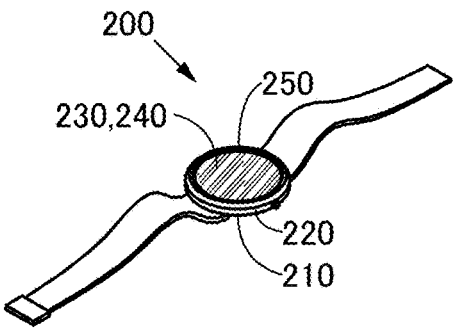
Figure 13C:
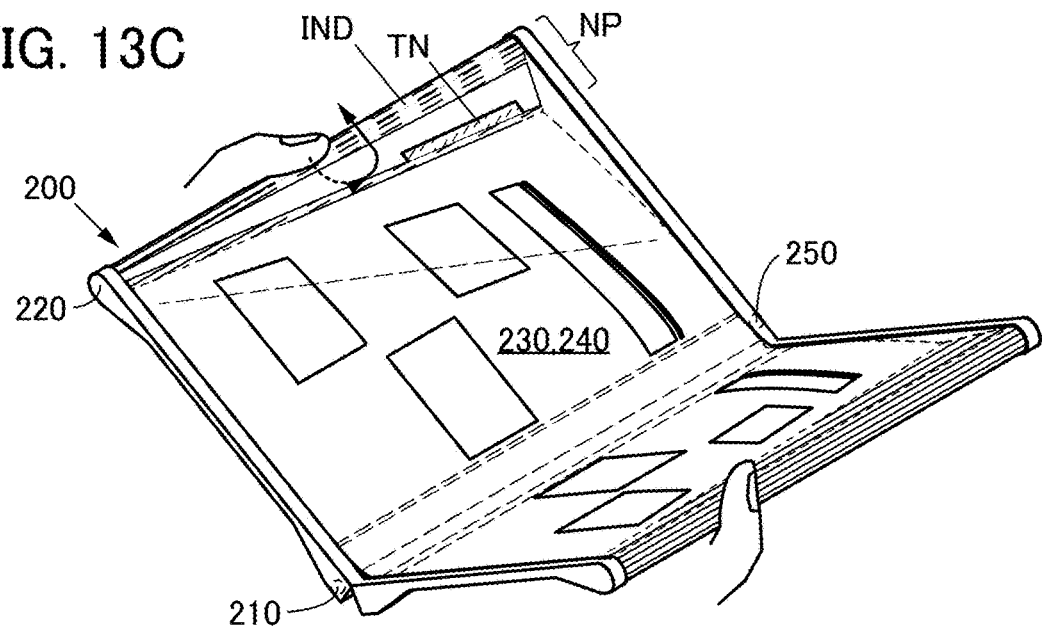

FIG. 13A is a block diagram illustrating a structure of the data processing device of one embodiment of the present invention. FIG. 13B and FIG. 13C are projection views illustrating examples of the appearance of the data processing device.

Figure 14A:
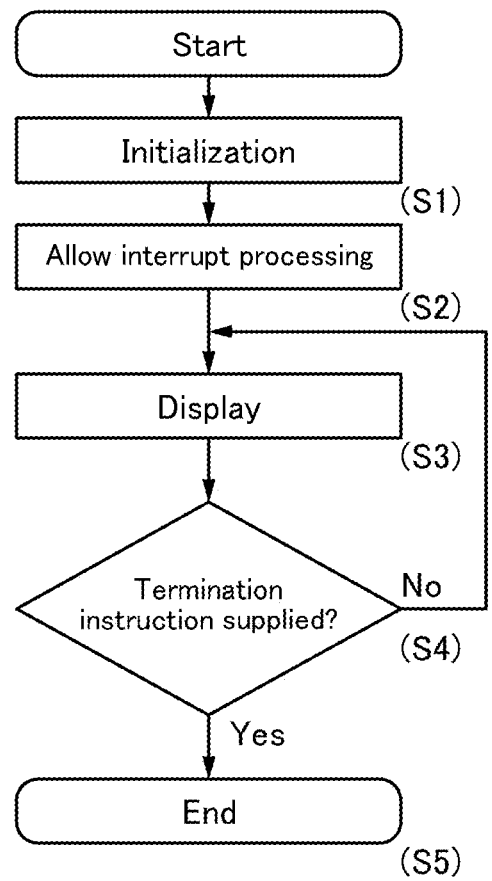
FIG. 14A and FIG. 14B are flow charts showing a method for driving a data processing device according to an embodiment.
Figure 14B:
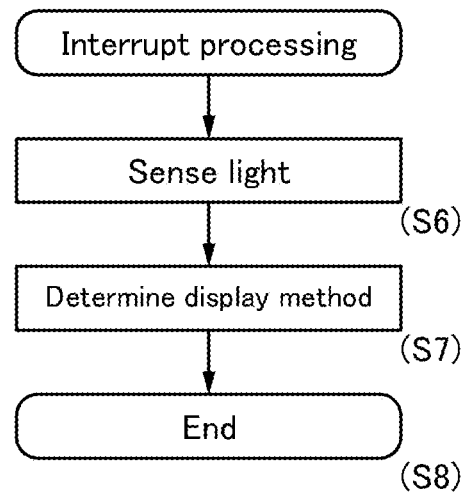

FIG. 14 is a flow chart showing a program of one embodiment of the present invention. FIG. 14A is a flow chart showing main processing of the program of one embodiment of the present invention, and FIG. 14B is a flow chart showing interrupt processing.

Figure 15A:
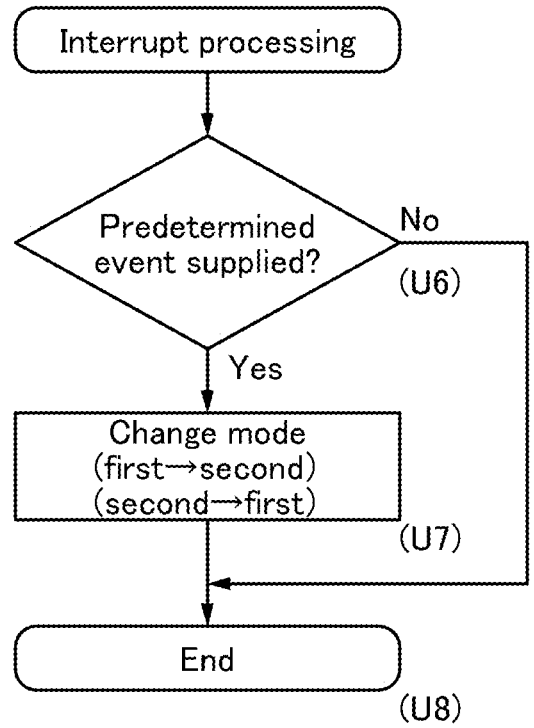
FIG. 15A to FIG. 15C are diagrams showing a method for driving a data processing device according to an embodiment.
Figure 15B:
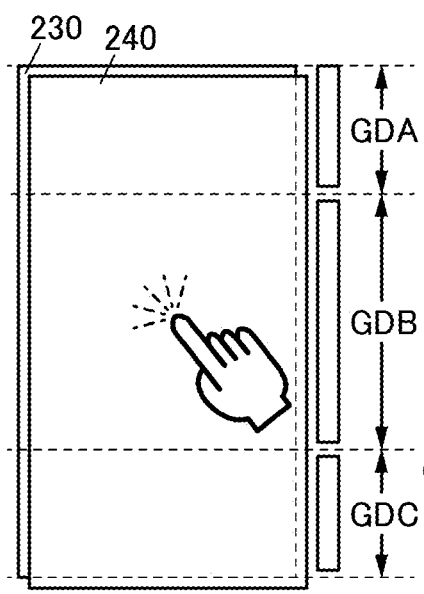
Figure 15C:
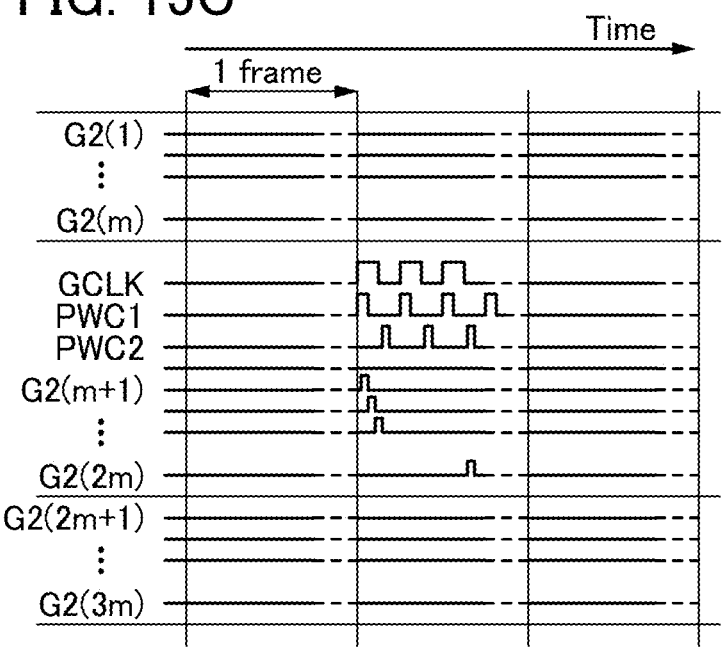

FIG. 15 shows the program of one embodiment of the present invention. FIG. 15A is a flow chart showing interrupt processing of the program of one embodiment of the present invention. FIG. 15B is a schematic view illustrating handling of the data processing device, and FIG. 15C is a timing chart showing the operation of the data processing device of one embodiment of the present invention.

<Structure Example 1 of Data Processing Device>

A data processing device 200 described in this embodiment includes the arithmetic device 210 and an input/output device 220 (see FIG. 13A). Note that the input/output device 220 is electrically connected to the arithmetic device 210. The data processing device 200 can also include a housing (see FIG. 13B and FIG. 13C).

<<Structure Example 1 of Arithmetic Device 210>>

The arithmetic device 210 is supplied with input information II or the sensing information DS. The arithmetic device 210 generates the control information CI and the image information VI on the basis of the input information II or the sensing information DS and supplies the control information CI and the image information VI.

The arithmetic device 210 includes an arithmetic portion 211 and a memory portion 212. The arithmetic device 210 also includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial information, setting information, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying information and being supplied with information. The input/output interface 215 can be electrically connected to the transmission path 214, for example. The input/output interface 215 can also be electrically connected to the input/output device 220.

The transmission path 214 includes a wiring and has a function of supplying information and being supplied with information. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input information II and the sensing information DS. The input/output device 220 is supplied with the control information CI and the image information VI (see FIG. 13A).

As the input information II, for example, a scan code of a keyboard, position information, operation information of buttons, sound information, or image information can be used. As the sensing information DS, for example, illuminance information, attitude information, acceleration information, bearing information, pressure information, temperature information, humidity information, or the like of the environment where the data processing device 200 is used, or the like can be used.

As the control information CI, for example, a signal controlling the luminance of display of the image information VI, a signal controlling the color saturation, or a signal controlling the hue can be used. Alternatively, a signal that changes display of part of the image information VI can be used as the control information CI.

The input/output device 220 includes the display portion 230, the input portion 240, and a sensor portion 250. For example, the input/output device described in Embodiment 5 can be used as the input/output device 220. The input/output device 220 can include a communication portion 290.

<<Structure Example of Display Portion 230>>

The display portion 230 displays the image information VI on the basis of the control information CI.

The display portion 230 includes the control portion 238, the driver circuit GD, the driver circuit SD, and the display panel 700 (see FIG. 10). For example, the display device described in Embodiment 4 can be used for the display portion 230.

<<Structure Example of Input Portion 240>>

The input portion 240 generates the input information II. For example, the input portion 240 has a function of supplying position information P1.

For example, a human interface or the like can be used as the input portion 240 (see FIG. 13A). Specifically, a keyboard, a mouse, a touch sensor, a microphone, a camera, or the like can be used as the input portion 240.

A touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes information on the position, path, or the like of a finger in contact with the touch panel and can determine that a predetermined gesture is supplied when the analysis results meet predetermined conditions. Thus, the user can supply a predetermined operation instruction associated with a predetermined gesture in advance by using the gesture.

For instance, the user can supply a "scroll instruction" for changing the display position of image information by using a gesture of moving a finger in contact with the touch panel along the touch panel.

The user can supply a "dragging instruction" for pulling out and displaying a navigation panel NP at an edge portion of the display region by using a gesture of moving a finger in contact with the edge portion of the display region (see FIG. 13C). Moreover, the user can supply a "leafing through instruction" for displaying index images IND, some parts of other pages, or thumbnail images TN of other pages in a predetermined order on the navigation panel NP so that the user can flip through these images, by using a gesture of moving the position where a finger presses hard. Alternatively, the instruction can be supplied by using the finger press pressure. Consequently, the user can turn the pages of an e-book like flipping through the pages of a paper book. Alternatively, the user can search a certain page with the aid of the thumbnail images TN or the index images IND.

<<Structure Example of Sensor Portion 250>>

The sensor portion 250 generates the sensing information DS. The sensor portion 250 has a function of sensing the illuminance of the environment where the data processing device 200 is used and a function of supplying illuminance information, for example.

The sensor portion 250 has a function of sensing the ambient conditions and supplying the sensing information. Specifically, illuminance information, attitude information, acceleration information, bearing information, pressure information, temperature information, humidity information, or the like can be supplied.

For example, a photosensor, an attitude sensor, an acceleration sensor, a direction sensor, a GPS (Global positioning system) signal receiving circuit, a pressure-sensitive switch, a pressure sensor, a temperature sensor, a humidity sensor, a camera, or the like can be used as the sensor portion 250.

<<Communication Portion 290>>

The communication portion 290 has a function of supplying information to a network and obtaining information from the network.

<<Housing>>

Note that the housing has a function of storing the input/output device 220 or the arithmetic device 210. Alternatively, the housing has a function of supporting the display portion 230 or the arithmetic device 210.

Thus, the control information can be generated on the basis of the input information or the sensing information. Alternatively, the image information can be displayed on the basis of the input information or the sensing information. Alternatively, the data processing device is capable of operating with knowledge of the intensity of light that the housing of the data processing device receives in the environment where the data processing device is used. Alternatively, the user of the data processing device can select a display method. As a result, a novel data processing device that is highly convenient, useful, or reliable can be provided.

Note that in some cases, these components cannot be clearly distinguished from each other and one component may also serve as another component or may include part of another component. For example, a touch panel in which a touch sensor overlaps with a display panel is an input portion as well as a display portion.

<<Structure Example 2 of Arithmetic Device 210>>

The arithmetic device 210 includes an artificial intelligence portion 213 (see FIG. 13A).

The artificial intelligence portion 213 is supplied with the input information II or the sensing information DS, and the artificial intelligence portion 213 infers the control information CI on the basis of the input information II or the sensing information DS. Moreover, the artificial intelligence portion 213 supplies the control information CI.

In this manner, the control information CI for display that can be felt suitable can be generated. Alternatively, display that can be felt suitable is possible. Alternatively, the control information CI for display that can be felt comfortable can be generated. Alternatively, display that can be felt comfortable is possible. As a result, a novel data processing device that is highly convenient, useful, or reliable can be provided.

[Natural Language Processing on Input Information II]

Specifically, the artificial intelligence portion 213 can perform natural language processing on the input information II to extract one feature from the whole input information II. For example, the artificial intelligence portion 213 can infer emotion or the like put in the input information II, which can be a feature. The artificial intelligence portion 213 can infer the color, design, font, or the like empirically felt suitable for the feature. The artificial intelligence portion 213 can generate information specifying the color, design, or font of a letter or information specifying the color or design of the background, and the information can be used as the control information CI.

Specifically, the artificial intelligence portion 213 can perform natural language processing on the input information II to extract some words included in the input information II. For example, the artificial intelligence portion 213 can extract expressions including a grammatical error, a factual error, emotion, and the like. The artificial intelligence portion 213 can generate the control information CI for displaying extracted part in the color, design, font, or the like different from those of another part, and the information can be used as the control information CI.

[Image Processing on Input Information II]

Specifically, the artificial intelligence portion 213 can perform image processing on the input information II to extract one feature from the input information II. For example, the artificial intelligence portion 213 can infer the age where the input information II is shot, whether the input information is shot indoors or outdoors, whether the input information is shot in the daytime or at night, or the like, which can be a feature. The artificial intelligence portion 213 can infer the color tone empirically felt suitable for the feature and generate the control information CI for use of the color tone for display. Specifically, information specifying color (e.g., full color, monochrome, or sepia) used for expression of a gradation can be used as the control information CI.

Specifically, the artificial intelligence portion 213 can perform image processing on the input information II to extract some images included in the input information II. For example, the artificial intelligence portion 213 can generate the control information CI for displaying a boundary between extracted part of the image and another part. Specifically, the artificial intelligence portion 213 can generate the control information CI for displaying a rectangle surrounding the extracted part of the image.

[Inference Using Sensing Data DS]

Specifically, the artificial intelligence portion 213 can generate an inference RI using the sensing data DS. Alternatively, the artificial intelligence portion 213 can generate the control data CI on the basis of the inference RI so that the user of the data processing device 200 can feel comfortable.

Specifically, the artificial intelligence portion 213 can generate the control information CI for adjustment of display brightness on the basis of the ambient illuminance or the like so that the display brightness can be felt comfortable. Alternatively, the artificial intelligence portion 213 can generate the control information CI for adjustment of volume on the basis of the ambient noise or the like so that the volume can be felt comfortable.

As the control information CI, a clock signal, a timing signal, or the like that is supplied to the control portion 238 included in the display portion 230 can be used. Alternatively, a clock signal, a timing signal, or the like that is supplied to a control portion included in the input portion 240 can be used as the control data CI.

<Structure Example 2 of Data Processing Device>

Another structure of the data processing device of one embodiment of the present invention will be described with reference to FIG. 14A and FIG. 14B.

<<Program>>

A program of one embodiment of the present invention has the following steps (see FIG. 14A).

[First Step]

In a first step, setting is initialized (see (51) in FIG. 14A).

For example, predetermined image information that is to be displayed on start-up, a predetermined mode for displaying the image information, and information for determining a predetermined display method for displaying the image information are acquired from the memory portion 212. Specifically, one still image information or another moving image information can be used as the predetermined image information. Furthermore, a first mode or a second mode can be used as the predetermined mode.

[Second Step]

In a second step, interrupt processing is allowed (see (S2) in FIG. 14A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can be executed any time after the program is started up.

[Third Step]

In a third step, image information is displayed by a predetermined mode or a predetermined display method selected in the first step or the interrupt processing (see (S3) in FIG. 14A). Note that the predetermined mode determines a mode for displaying the information, and the predetermined display method determines a method for displaying the image information. For example, the image information VI can be used as information to be displayed.

One method for displaying the image information VI can be associated with the first mode, for example. Alternatively, another method for displaying the image information VI can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, to perform display in response to the selection signals can be associated with the first mode.

For example, when selection signals are supplied at a frequency of 30 Hz or higher, preferably 60 Hz or higher, the movement of a displayed moving image can be smooth.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, to perform display in response to the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

In the case where a light-emitting element is used as a display element, for example, the light-emitting element can be made to emit light in a pulsed manner so that the image information is displayed. Specifically, an organic EL element can be made to emit light in a pulsed manner, and its afterglow can be used for display. The organic EL element has excellent frequency characteristics; thus, time for driving the light-emitting element can be shortened and the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied (Yes), whereas the program proceeds to the third step when the termination instruction has not been supplied (No) (see (S4) in FIG. 14A).

For example, the termination instruction supplied in the interrupt processing may be used for the determination.

[Fifth Step]

In the fifth step, the program terminates (see (S5) in FIG. 14A).

<<Interrupt Processing>>

The interrupt processing includes a sixth step to an eighth step described below (see FIG. 14B).

[Sixth Step]

In the sixth step, the illuminance of the environment where the data processing device 200 is used is sensed using the sensor portion 250, for example (see (S6) in FIG. 14B). Note that color temperature or chromaticity of ambient light may be sensed instead of the illuminance of the environment.

[Seventh Step]

In the seventh step, a display method is determined on the basis of the sensed illuminance information (see (S7) in FIG. 14B). For example, a display method is determined such that the display brightness is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see (S8) in FIG. 14B).

<Structure Example 3 of Data Processing Device>

Another structure of the data processing device of one embodiment of the present invention will be described with reference to FIG. 15.

FIG. 15A is a flow chart showing a program of one embodiment of the present invention. FIG. 15A is a flow chart showing interrupt processing different from the interrupt processing shown in FIG. 14B.

Note that the structure example 3 of the data processing device is different from the interrupt processing described with reference to FIG. 14B in that the interrupt processing includes a step of changing a mode on the basis of a supplied predetermined event. Different portions will be described in detail here, and the above description is referred to for portions that can use similar structures.

<<Interrupt Processing>>

The interrupt processing includes a sixth step to an eighth step described below (see FIG. 15A).

[Sixth Step]

In the sixth step, the program proceeds to the seventh step when a predetermined event has been supplied (Yes), whereas the program proceeds to the eighth step when the predetermined event has not been supplied (No) (see (U6) in FIG. 15A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 15A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 15B).

For example, the display mode of the region where a selection signal is supplied from the driver circuit GDB can be changed when a predetermined event is supplied to the input portion 240 in a region overlapping with the region where the selection signal is supplied from the driver circuit GDB (see FIG. 15B and FIG. 15C). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G2($m$+1) to a scan line G2(2$m$) in response to the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 15A). Note that the interrupt processing may be repeatedly executed in a period during which the main processing is executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, the drag speed, and the like can be used to assign arguments to an instruction associated with a predetermined event.

For example, information sensed by the sensor portion 250 is compared with a predetermined threshold value, and the compared results can be used for the event.

Specifically, a pressure sensor or the like in contact with a button or the like that is provided so as to be pushed in a housing can be used for the sensor portion 250.

<<Instruction Associated with Predetermined Event>>

For example, a termination instruction can be associated with a predetermined event.

For example, a "page-turning instruction" for switching display from one displayed image information to another image information can be associated with a predetermined event. Note that an argument determining the page-turning speed or the like, which is used when the "page-turning instruction" is executed, can be supplied using the predetermined event.

For example, a "scroll instruction" for moving the display position of displayed part of image information and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image information, or the like can be associated with a predetermined event. Note that an argument determining the brightness of a generated image can be associated with a predetermined event. An argument determining the brightness of a generated image may be determined on the basis of ambient brightness sensed by the sensor portion 250.

For example, an instruction for acquiring information distributed via a push service using the communication portion 290 or the like can be associated with a predetermined event.

Note that position information sensed by the sensor portion 250 may be used to determine the presence or absence of a qualification for acquiring information. Specifically, it may be determined that there is a qualification for acquiring information in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 13C). Alternatively, materials distributed in a conference room in, for example, a company can be received and used for a conference material.

Note that this embodiment can be combined with other embodiments in this specification as appropriate.

Embodiment 7

In this embodiment, a structure of a data processing device of one embodiment of the present invention will be described with reference to FIG. 16 to FIG. 18

Figure 16A:
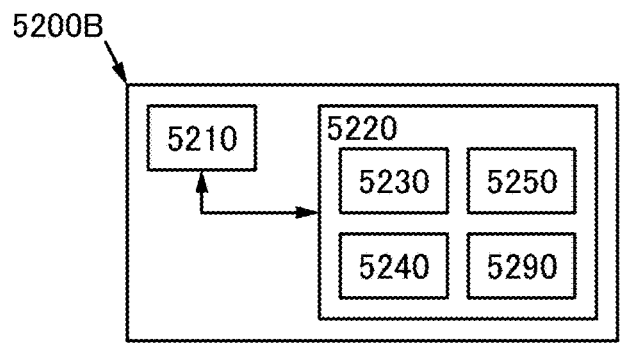
FIG. 16A to FIG. 16E are diagrams illustrating structures of a data processing device according to an embodiment.
Figure 16B:
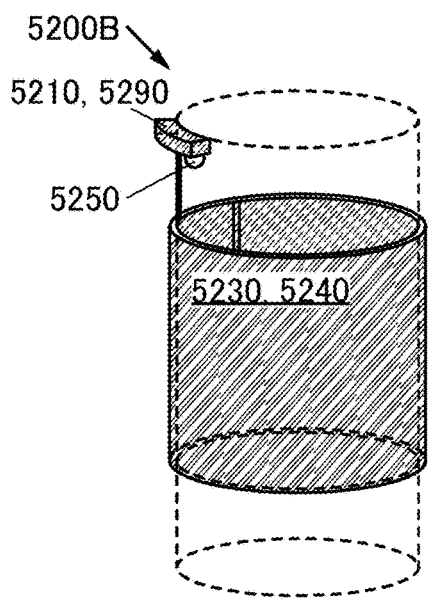
Figure 16C:
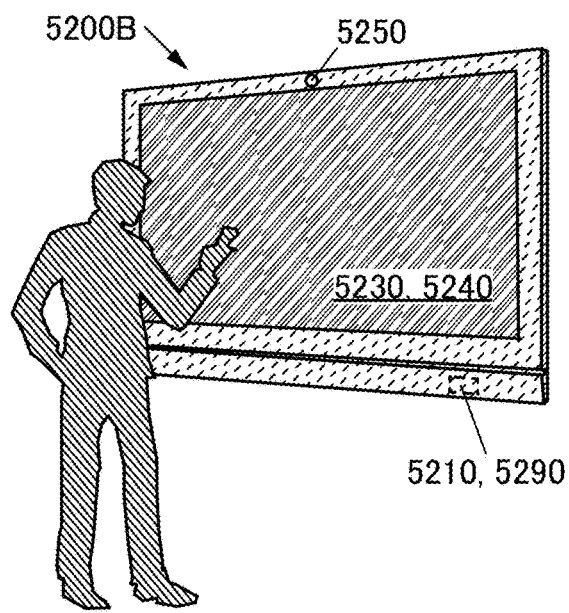
Figure 16D:
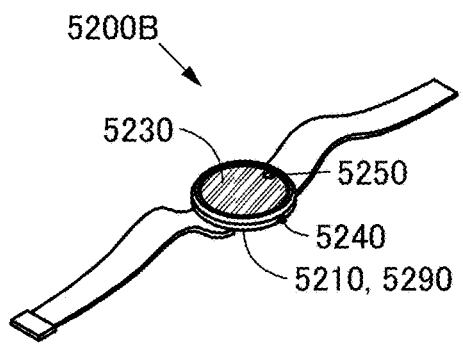
Figure 16E:
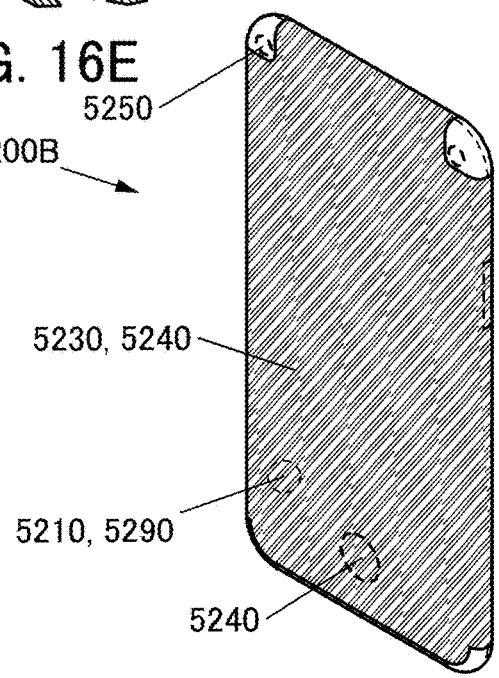
Figure 17A:
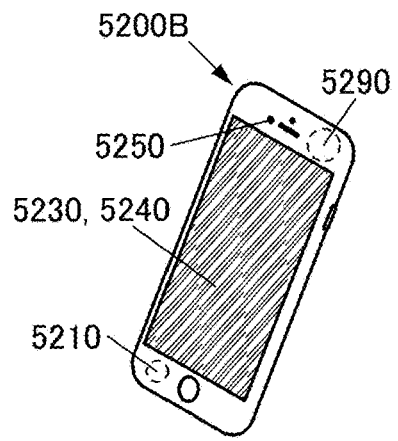
FIG. 17A to FIG. 17E are diagrams illustrating structures of a data processing device according to an embodiment.
Figure 17B:
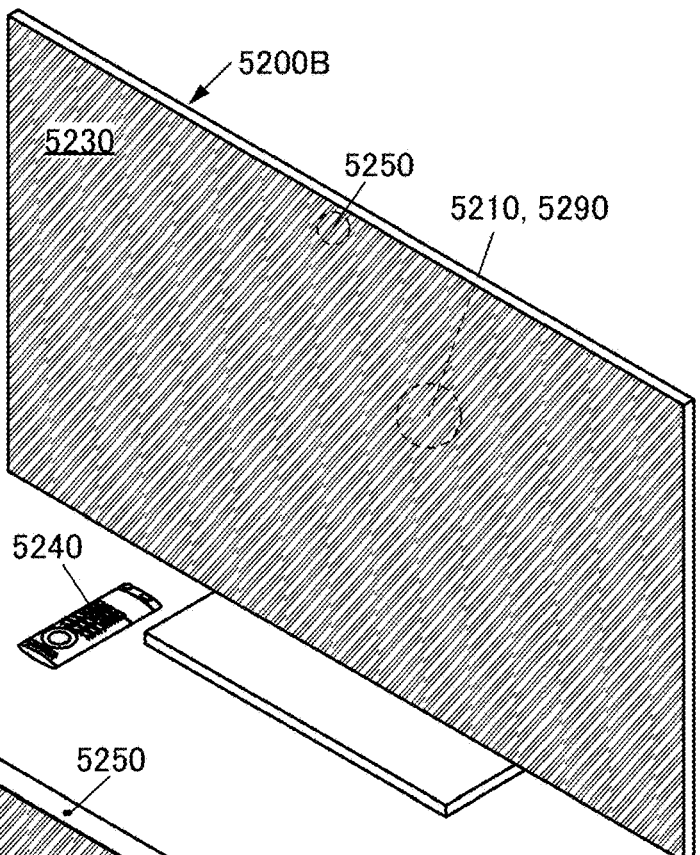
Figure 17C:
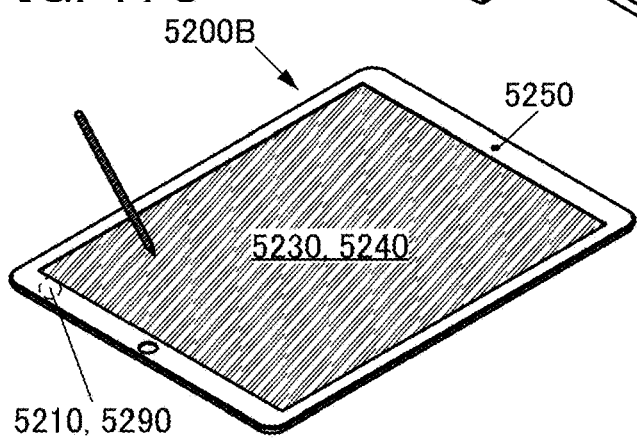
Figure 17D:
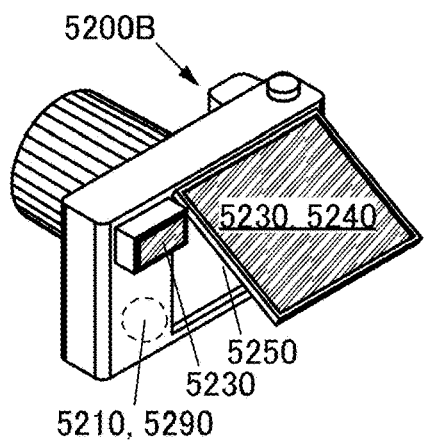
Figure 17E:
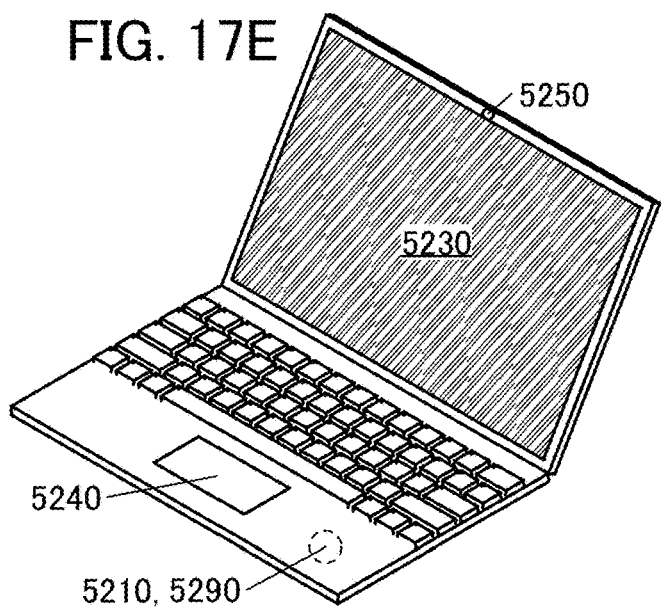
Figure 18A:
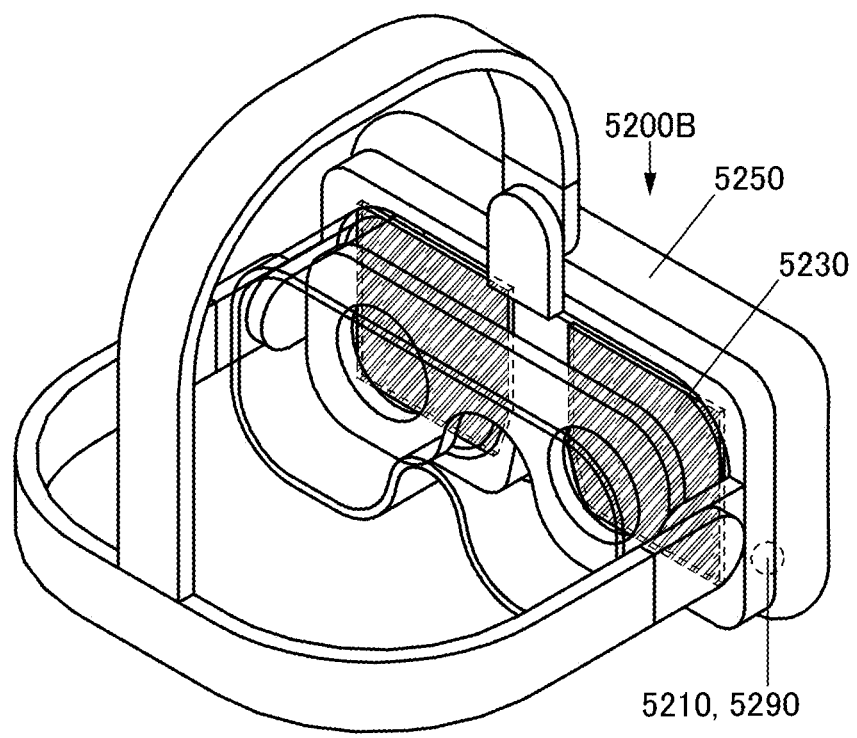
FIG. 18A and FIG. 18B are diagrams illustrating structures of a data processing device according to an embodiment.
Figure 18B:
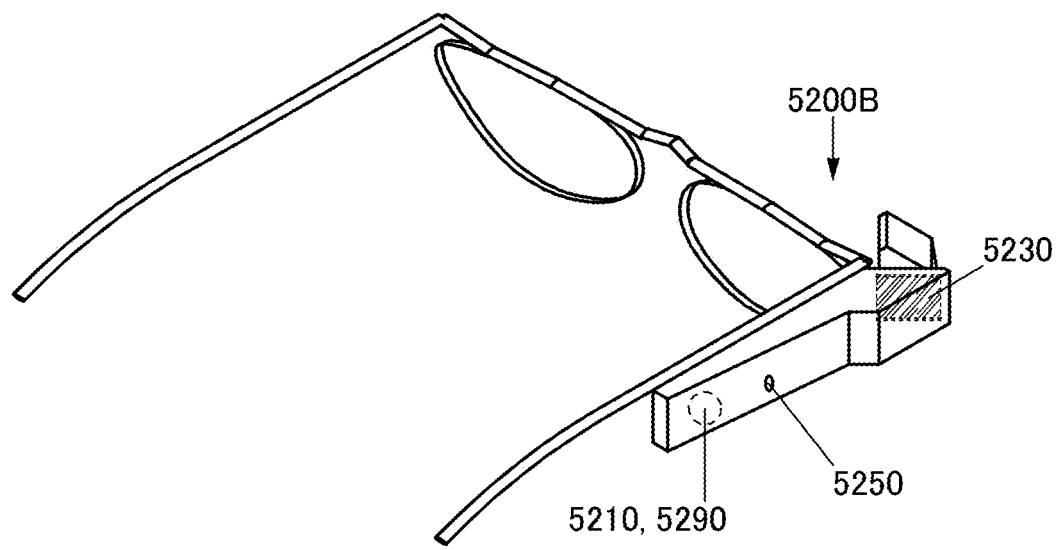

FIG. 16 to FIG. 18 are diagrams illustrating structures of the data processing device of one embodiment of the present invention. FIG. 16A is a block diagram of the data processing device, and FIG. 16B to FIG. 16E are perspective views illustrating structures of the data processing device. FIG. 17A to FIG. 17E are perspective views illustrating structures of the data processing device. FIG. 18A and FIG. 18B are perspective views illustrating structures of the data processing device.

<Data Processing Device>

A data processing device 5200B described in this embodiment includes an arithmetic device 5210 and an input/output device 5220 (see FIG. 16A).

The arithmetic device 5210 has a function of being supplied with operation information and a function of supplying image information on the basis of the operation information.

The input/output device 5220 includes a display portion 5230, an input portion 5240, a sensor portion 5250, and a communication portion 5290 and has a function of supplying operation information and a function of being supplied with image information. The input/output device 5220 also has a function of supplying sensing information, a function of supplying communication information, and a function of being supplied with communication information.

The input portion 5240 has a function of supplying operation information. For example, the input portion 5240 supplies operation information on the basis of operation by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image information. For example, the display panel described in Embodiment 2 or Embodiment 3 can be used for the display portion 5230.

The sensor portion 5250 has a function of supplying sensing information. For example, the sensor portion 5250 has a function of sensing a surrounding environment where the data processing device is used and supplying the information as the sensing information.

Specifically, an illuminance sensor, an imaging device, an attitude sensing device, a pressure sensor, a human motion sensor, or the like can be used as the sensor portion 5250.

The communication portion 5290 has a function of being supplied with communication information and a function of supplying communication information. For example, the communication portion 5290 has a function of being connected to another electronic device or a communication network through wireless communication or wired communication. Specifically, the communication portion 5290 has a function of wireless local area network communication, telephone communication, near field communication, or the like.

<<Structure Example 1 of Data Processing Device>>

For example, the display portion 5230 can have an outer shape along a cylindrical column or the like (see FIG. 16B). The data processing device has a function of changing its display method in accordance with the illuminance of a usage environment. Furthermore, the data processing device has a function of changing displayed content in response to sensed existence of a person. This allows the data processing device to be provided on a column of a building, for example. Alternatively, the data processing device can display advertising, guidance, or the like. Alternatively, the data processing device can be used for digital signage or the like.

<<Structure Example 2 of Data Processing Device>>

For example, the data processing device has a function of generating image information on the basis of the path of a pointer used by the user (see FIG. 16C). Specifically, a display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

<<Structure Example 3 of Data Processing Device>>

The data processing device can receive information from another device and display the information on the display portion 5230 (see FIG. 16D). Several options can be displayed. The user can choose some from the options and send a reply to a transmitter of the information. For example, the data processing device has a function of changing its display method in accordance with the illuminance of a usage environment. Thus, for example, the power consumption of a smartwatch can be reduced. Alternatively, for example, a smartwatch can display an image so as to be suitably used even in an environment under strong external light, e.g., outdoors in fine weather.

<<Structure Example 4 of Data Processing Device>>

For example, the display portion 5230 has a surface gently curved along a side surface of a housing (see FIG. 16E). The display portion 5230 includes a display panel, and the display panel has a function of displaying information on the front surface, the side surfaces, the top surface, and the rear surface, for example. Thus, for example, a mobile phone can display information not only on its front surface but also on its side surfaces, top surface, and rear surface.

<<Structure Example 5 of Data Processing Device>>

For example, the data processing device can receive information via the Internet and display the information on the display portion 5230 (see FIG. 17A). A created message can be checked on the display portion 5230. The created message can be sent to another device. For example, the data processing device has a function of changing its display method in accordance with the illuminance of a usage environment. Thus, the power consumption of a smartphone can be reduced. Alternatively, for example, a smartphone can display an image so as to be suitably used even in an environment under strong external light, e.g., outdoors in fine weather.

<<Structure Example 6 of Data Processing Device>>

A remote controller can be used as the input portion 5240 (see FIG. 17B). For example, the data processing device can receive information from a broadcast station or via the Internet and display the information on the display portion 5230. An image of the user can be captured using the sensor portion 5250. The image of the user can be transmitted. The data processing device can acquire a viewing history of the user and provide it to a cloud service. The data processing device can acquire recommendation information from a cloud service and display the information on the display portion 5230. A program or a moving image can be displayed on the basis of the recommendation information. For example, the data processing device has a function of changing its display method in accordance with the illuminance of a usage environment. Thus, for example, a television system can display an image to be suitably used even when irradiated with strong external light that enters a room in fine weather.

<<Structure Example 7 of Data Processing Device>>

For example, the data processing device can receive educational materials via the Internet and display them on the display portion 5230 (see FIG. 17C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, an image signal can be received from another data processing device and displayed on the display portion 5230. When the data processing device is placed on a stand or the like, the display portion 5230 can be used as a sub-display. Thus, for example, a tablet computer can display an image to be suitably used even in an environment under strong external light, e.g., outdoors in fine weather.

<<Structure Example 8 of Data Processing Device>>

The data processing device includes, for example, a plurality of display portions 5230 (see FIG. 17D). For example, the display portion 5230 can display an image that the sensor portion 5250 is capturing. A captured image can be displayed on the sensor portion. A captured image can be decorated using the input portion 5240. A message can be attached to a captured image. A captured image can be transmitted via the Internet. The data processing device has a function of changing its shooting conditions in accordance with the illuminance of a usage environment. Thus, for example, a digital camera can display a subject in such a manner that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 17E). As another example, part of image information can be displayed on the display portion 5230 and another part of the image information can be displayed on a display portion of another data processing device. Alternatively, image signals can be supplied. Alternatively, with the communication portion 5290, information to be written can be obtained from an input portion of another data processing device. Thus, a large display region can be utilized by using a portable personal computer, for example.

<<Structure Example 10 of Data Processing Device>>

The data processing device includes, for example, the sensor portion 5250 that senses an acceleration or a direction (see FIG. 18A). The sensor portion 5250 can supply information on the position of the user or the direction in which the user faces. The data processing device can generate image information for the right eye and image information for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensor portion 5250 that senses an acceleration or a direction (see FIG. 18B). The sensor portion 5250 can supply information on the position of the user or the direction in which the user faces. The data processing device can generate image information in accordance with the position of the user or the direction in which the user faces. Thus, the information can be superimposed on a real-world scene, for example. An augmented reality image can be displayed on a glasses-type data processing device.

EXAMPLE

In this example, a structure, evaluation results, and display results of a fabricated display device will be described with reference to FIG. 19 to FIG. 21.

Figure 19A:
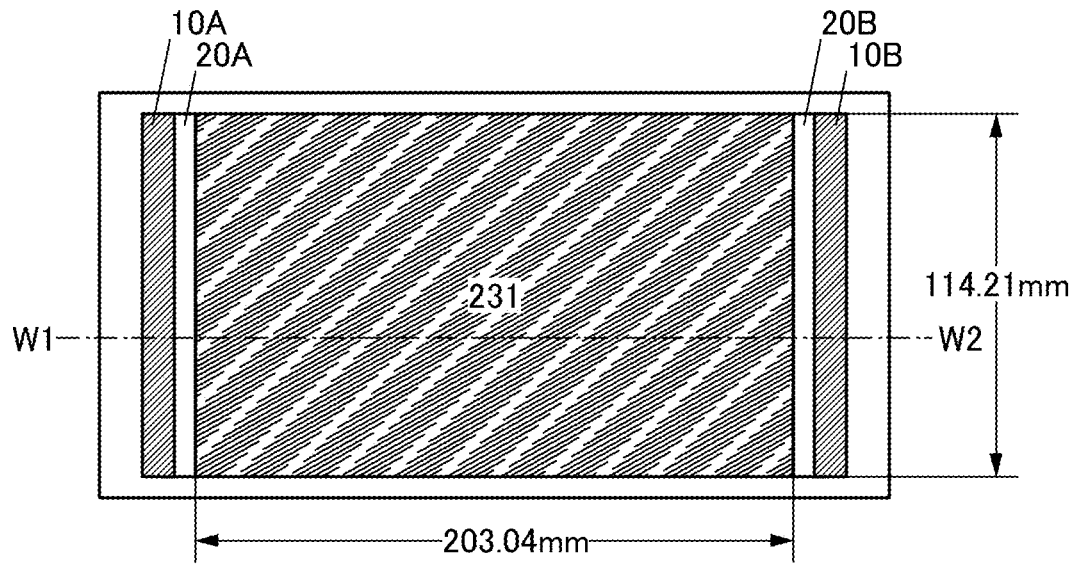
FIG. 19A to FIG. 19C are diagrams illustrating a structure of a display device according to an example.
Figure 19B:
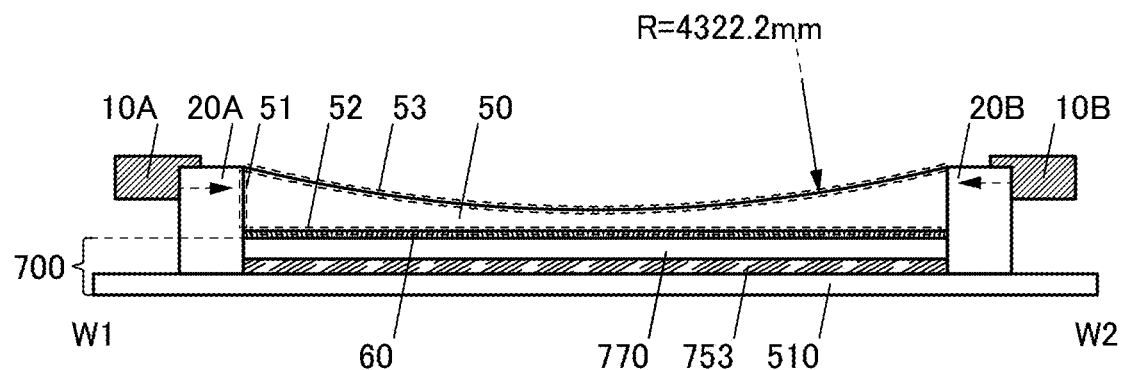
Figure 19C:
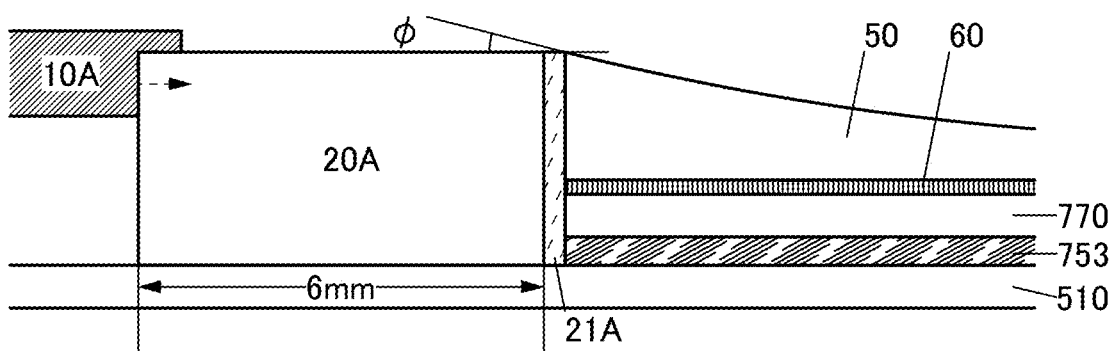

FIG. 19 illustrates the structure of the fabricated display device of one embodiment of the present invention. FIG. 19A is atop view of the display device, and FIG. 19B is a cross-sectional view along a cutting line W1-W2 in FIG. 19A. FIG. 19C is a diagram illustrating part of FIG. 19B.

Figure 20:
FIG. 20 is a photograph showing a display result of a display device according to an example.

FIG. 20 is a photograph showing display results of the fabricated display device of one embodiment of the present invention.

Figure 21:
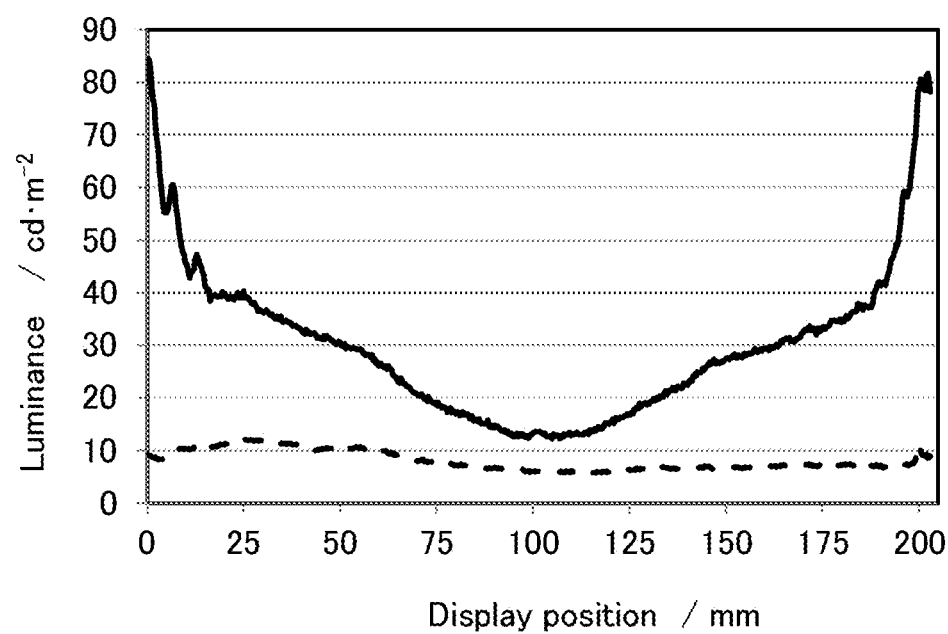
FIG. 21 is a diagram showing display characteristics of a display device according to an example.

FIG. 21 is a diagram showing display characteristics of the fabricated display device of one embodiment of the present invention.

<Structure Example 1 of Display Device>

The display device of one embodiment of the present invention includes the light guide plate 50, the display panel 700, and the intermediate layer 60 (see FIG. 19A to FIG. 19C).

<<Structure Example 1 of Light Guide Plate 50>>

The light guide plate 50 includes the surface 51 and the surface 52, and the surface 51 is irradiated with light (see FIG. 19B).

Specifically, light irradiation was performed using a light source 10A including red LEDs, green LEDs, and blue LEDs arranged in an array. A block of acrylic resin and a diffusion plate 21A were used for an optical element 20A (see FIG. 19C). Moreover, the fabricated display device includes a light source 10B and an optical element 20B. The light source 10B is positioned so as to face the light source 10A and emits light to a surface facing the surface 51.

The surface 52 has a function of distributing light. Specifically, light incident from the surface 51 is distributed over the entire surface 52. The surface 52 is in contact with the intermediate layer 60, and the surface 52 has a refractive index N1 in a region in contact with the intermediate layer 60. Specifically, an acrylic resin having a refractive index of 1.5 was used for the light guide plate 50.

The light guide plate 50 includes the surface 53. The surface 53 has a slope $\phi$ with respect to the surface 52 in a region overlapping with the display region 231 (see FIG. 19B and FIG. 19C). Specifically, a curved surface toward the surface 52 was used as the surface 53. The curvature radius of the curved surface was 4322.2 mm. Note that the slope $\phi$ is 2° or less in a cross section including the thickness direction of the light guide plate 50. Specifically, the slope 4 is approximately 1.41° or less. The light guide plate 50 has a thickness of 2 mm in a region in contact with the diffusion plate 21. The base material 510 has a thickness of 0.7 mm, the layer 753 containing a liquid crystal material has a thickness of 3 μm, the base material 770 has a thickness of 0.7 mm, and the intermediate layer 60 has a thickness of 50 μm (see FIG. 19C).

<<Structure Example 1 of Display Panel 700>>

The display panel 700 faces the surface 52, and the display panel 700 is in contact with the intermediate layer 60. The display panel 700 has a function of scattering the distributed light.

The display panel 700 includes the display region 231. Specifically, the display region 231 was 114.21 mm high and 203.04 mm wide (see FIG. 19A and Table 1).

<<Structure Example 1 of Intermediate Layer 60>>

The intermediate layer 60 includes a region positioned between the surface 52 and the display panel 700 (see FIG. 19B).

The intermediate layer 60 has a refractive index N2 in a region in contact with the surface 52, and the refractive index N2 is smaller than the refractive index N1. Specifically, a fluorine-based inert liquid having a refractive index of 1.29 was used for the intermediate layer 60.

Table 1 shows specifications of the fabricated display device.

TABLE 1

| | |
|---|---|
| Panel size | 9.17 inch |
| Panel external size | 128.0 mm (H) × 259.0 mm (V) |
| Display area | 114.21 mm (H) × 203.04 mm (V) |
| Number of effective pixels | 540 (H) × 960 (V) |
| Pixel size | 211.5 μm (H) × 211.5 μm (V) |
| Resolution | 120 ppi |
| Liquid crystal mode | Dispersed liquid crystal |
| Coloring method | Field sequential method |
| Aperture ratio | 81.60% |
| Frame frequency | 60 Hz (6 subframes) |
| Video signal format | Analog line sequential |
| Source driver | 4 drivers with TAB |
| Gate driver | Integrated (input from both left and right, separate input to upper part and lower part of panel) |
| FPC specifications | 4 FPCs each having 71 pins |

<Display Results of Display Device>

FIG. 20 shows the results of displaying an image using the fabricated display device. Note that IMAGE1 in the drawing is a full-color image displayed by the display device, and IMAGE2 in the drawing is a printed material that is seen through the display device. In this manner, both high transmittance and clear display were achieved.

<Evaluation Results of Display Device>

The dependence of luminance displayed by the fabricated display device on display position was evaluated (see FIG. 21). The solid line shows a luminance distribution in the case where an image signal for the highest gray level is supplied to the entire surface of the display region 231. The dashed line shows a luminance distribution in the case where an image signal for the lowest gray level is supplied to the entire surface of the display region 231. Note that the display position was the distance from an end portion of the display region 231 to the measurement position along the long side (203.04 mm) direction of the display region 231 (see FIG. 19).

Note that this example can be combined with other embodiments described in this specification as appropriate.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that allow electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conducting state (on state) or a non-conducting state (off state) to control whether to flow a current. Alternatively, a switch has a function of selecting and changing a current path. Note that the case where X and Y are electrically connected includes the case where X and Y are directly connected.

For example, in the case where X and Y are functionally connected, at least one circuit that allows functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is provided between X and Y, X and Y are regarded as being functionally connected when a signal output from X is transmitted to Y. Note that the case where X and Y are functionally connected includes the case where X and Y are directly connected and the case where X and Y are electrically connected.

Note that an explicit description "X and Y are electrically connected" means that the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are regarded as being disclosed in this specification and the like. That is, the explicit description "X and Y are electrically connected" is considered to be disclosure of the same contents as ones using a simple and explicit description "X and Y are connected" in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed, for example, as "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, the expression "a source (or a first terminal or the like) of a transistor is electrically connected to X through Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor" can be used. When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples, and the expression is not limited to these expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

AF1: alignment film, AF2: alignment film, ANO: conductive film, C11: capacitor, C12: capacitor, C21: capacitor, C22: capacitor, CI: control information, CSCOM: conductive film, CP: conductive material, DS: sensing information, GCLK: signal, G1: scan line, G2: scan line, II: input information, KB1: structure body, M: transistor, P1: position information, PWC1: signal, PWC2: signal, S1: signal line, S2: signal line, SP: control signal, SW11: switch, SW12: switch, SW21: switch, SW22: switch, SW23: switch, SW24: switch, VO: conductive film, V11: information, VCOM1: conductive film, VI: image information, FPC1: flexible printed circuit, 10: light source, 10A: light source, 10B: light source, 20: optical element, 20A: optical element, 20B: optical element, 21: prism, 21A: diffusion plate, 22: lens, 50: light guide plate, 51: surface, 52: surface, 53: surface, 54: surface, 54R: reflective film, 60: intermediate layer, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 250: sensor portion, 290: communication portion, 501C: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521A: insulating film, 521B: insulating film, 524: conductive film, 530: pixel circuit, 591A: opening portion, 700: display panel, 700TP: input/output panel, 702: pixel, 705: sealant, 750: display element, 751: electrode, 752: electrode, 753: layer, 754: conductive film, 770: base material, 770P: functional film, 802: sensor, 5200B: data processing device, 5210: arithmetic device, 5220: input/output device, 5230: display portion, 5240: input portion, 5250: sensor portion, 5290: communication portion

The invention claimed is:
1. A display device comprising:
a light guide plate;
a display panel;
an intermediate layer; and
an optical element between the light guide plate and a light source,
wherein the light guide plate comprises a first surface and a second surface,
wherein the second surface is included in a plane intersecting a plane including the first surface,
wherein the first surface is configured to be irradiated with light,
wherein the second surface is configured to distribute the light,
wherein the second surface is in contact with the intermediate layer,
wherein the second surface comprises a first refractive index in a region in contact with the intermediate layer,
wherein the display panel faces the second surface with the intermediate layer positioned therebetween, wherein the intermediate layer comprises a region positioned between the second surface and the display panel, wherein the intermediate layer comprises a second refractive index in a region in contact with the second surface, wherein the second refractive index is smaller than the first refractive index, wherein the optical element comprises a first lens including a first curved surface and a second lens including a second curved surface, wherein the first curved surface comprises a first curvature radius in a plane including the thickness direction, wherein the second curved surface comprises a third curvature radius in a plane including the thickness direction, and wherein the first curvature radius is different from the third curvature radius.

2. The display device according to claim 1, wherein the display panel comprises a display region, wherein the light guide plate comprises a third surface, wherein the third surface comprises a slope with respect to the second surface in a region overlapping with the display region, and wherein the slope is 2° or less in a cross section including a thickness direction of the light guide plate.

3. The display device according to claim 1, wherein the light guide plate comprises a fourth surface, wherein the fourth surface faces the first surface, wherein the fourth surface comprises a reflective film, and wherein the reflective film is configured to reflect the light.

4. The display device according to claim 1, wherein the display panel comprises a display region, wherein the display region comprises a first scan line, a second scan line, a first signal line, a second signal line, and a pixel, wherein the pixel comprises a display element and a pixel circuit, wherein the display element is electrically connected to the pixel circuit, wherein the pixel circuit is electrically connected to the first scan line, the second scan line, the first signal line, and the second signal line, wherein the pixel circuit comprises a first switch, a second switch, a first capacitor, a second capacitor, a node, and a conductive film, wherein the first switch comprises a first terminal supplied with a first signal, wherein the first switch comprises a second terminal electrically connected to the node, wherein the first capacitor comprises a first electrode electrically connected to the node, wherein the first capacitor comprises a second electrode electrically connected to the conductive film, wherein the second switch comprises a first terminal supplied with a second signal, wherein the second switch comprises a second terminal electrically connected to a first electrode of the second capacitor, and wherein the second capacitor comprises a second electrode electrically connected to the node.

5. The display device according to claim 4, wherein the display element comprises a first electrode, a second electrode, a layer containing a liquid crystal material, a first alignment film, and a second alignment film, wherein the first alignment film comprises a region positioned between the first electrode and the layer containing the liquid crystal material, wherein the second alignment film comprises a region positioned between the second electrode and the layer containing the liquid crystal material, wherein the second electrode is positioned such that an electric field crossing the layer containing the liquid crystal material is formed between the first electrode and the second electrode, wherein the layer containing the liquid crystal material scatters incident light with a first scattering intensity when the electric field is in a first state, wherein the layer containing the liquid crystal material scatters the incident light with a second scattering intensity when the electric field is in a second state where the electric field is stronger than that in the first state, wherein the second scattering intensity is greater than or equal to 10 times the first scattering intensity, wherein the layer containing the liquid crystal material comprises the liquid crystal material and a polymer material, wherein the layer containing the liquid crystal material is stabilized by the polymer material, and wherein the polymer material is a copolymer of a polyfunctional monomer and a monofunctional monomer.

6. A data processing device comprising at least one of a keyboard, a hardware button, a pointing device, a touch sensor, an illuminance sensor, an imaging device, an audio input device, an eye-gaze input device, and an attitude sensing device; and the display device according to claim 1.

7. The display device according to claim 1, wherein the light irradiated to the first surface comprises a first intensity distribution in a cross section including a thickness direction of the light guide plate and a second intensity distribution in a cross section orthogonal to the thickness direction, and wherein the second intensity distribution is wider than the first intensity distribution.

8. The display device according to claim 1, wherein the optical element is configured to adjust an intensity distribution of light emitted from the light source to the first and second intensity distributions of the light irradiated to the first surface.

9. The display device according to claim 1, wherein the first curved surface comprises a second curvature radius in a plane including a width direction intersecting the thickness direction, and wherein the second curvature radius is larger than the first curvature radius.

10. The display device according to claim 1, wherein the second curved surface comprises a fourth curvature radius in the plane including the width direction intersecting the thickness direction, and wherein the fourth curvature radius is larger than the third curvature radius.

11. The display device according to claim 1, wherein the optical element further comprises a prism, and wherein the prism comprises a sloping surface extending in the width direction.

12. A display device comprising:
a light guide plate;
a display panel;
an intermediate layer; and
an optical element between the light guide plate and a light source,
wherein the light guide plate comprises a first surface and a second surface,
wherein the first surface is configured to be irradiated with light,
wherein the second surface is configured to distribute the light,
wherein the second surface comprises a first refractive index in a region in contact with the intermediate layer,
wherein the display panel faces the second surface with the intermediate layer positioned therebetween,
wherein the intermediate layer comprises a second refractive index in a region in contact with the second surface,
wherein the second refractive index is smaller than the first refractive index,
wherein the optical element comprises a first lens including a first curved surface and a second lens including a second curved surface,
wherein the first curved surface comprises a first curvature radius in a plane including the thickness direction,
wherein the second curved surface comprises a third curvature radius in a plane including the thickness direction, and
wherein the first curvature radius is different from the third curvature radius.

13. The display device according to claim 12,
wherein the light irradiated to the first surface comprises a first intensity distribution in a cross section including a thickness direction of the light guide plate and a second intensity distribution in a cross section orthogonal to the thickness direction, and
wherein the second intensity distribution is wider than the first intensity distribution.

14. The display device according to claim 12,
wherein the optical element is configured to adjust an intensity distribution of light emitted from the light source to the first and second intensity distributions of the light irradiated to the first surface.

15. The display device according to claim 12,
wherein the first curved surface comprises a second curvature radius in a plane including a width direction intersecting the thickness direction, and
wherein the second curvature radius is larger than the first curvature radius.

16. The display device according to claim 12,
wherein the second curved surface comprises a fourth curvature radius in the plane including the width direction intersecting the thickness direction, and
wherein the fourth curvature radius is larger than the third curvature radius.

17. The display device according to claim 12,
wherein the optical element further comprises a prism, and
wherein the prism comprises a sloping surface extending in the width direction.

18. The display device according to claim 12,
wherein the display panel comprises a display region,
wherein the light guide plate comprises a third surface,
wherein the third surface comprises a slope with respect to the second surface in a region overlapping with the display region, and
wherein the slope is 2° or less in a cross section including a thickness direction of the light guide plate.

19. The display device according to claim 12,
wherein the light guide plate comprises a fourth surface,
wherein the fourth surface faces the first surface,
wherein the fourth surface comprises a reflective film, and
wherein the reflective film is configured to reflect the light.

20. A data processing device comprising at least one of a keyboard, a hardware button, a pointing device, a touch sensor, an illuminance sensor, an imaging device, an audio input device, an eye-gaze input device, and an attitude sensing device; and the display device according to claim 12.

* * * * *